(12) United States Patent
Bae et al.

(10) Patent No.: US 12,224,382 B2
(45) Date of Patent: Feb. 11, 2025

(54) DISPLAY DEVICE

(71) Applicant: Samsung Display Co., LTD., Yongin-si (KR)

(72) Inventors: Kwang Soo Bae, Yongin-si (KR); Beom Soo Park, Yongin-si (KR); Min Jeong Oh, Yongin-si (KR); Young Je Cho, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 173 days.

(21) Appl. No.: 18/167,746

(22) Filed: Feb. 10, 2023

(65) Prior Publication Data

US 2023/0197909 A1 Jun. 22, 2023

Related U.S. Application Data

(62) Division of application No. 16/857,000, filed on Apr. 23, 2020, now Pat. No. 11,600,750.

(30) Foreign Application Priority Data

Sep. 20, 2019 (KR) .......................... 10-2019-0116130

(51) Int. Cl.
*H01L 33/50* (2010.01)
*G09G 3/32* (2016.01)
(Continued)

(52) U.S. Cl.
CPC .............. *H01L 33/502* (2013.01); *G09G 3/32* (2013.01); *H01L 27/156* (2013.01); *H01L 33/24* (2013.01);
(Continued)

(58) Field of Classification Search
CPC ............... H01L 25/0753; H01L 27/156; H01L 2933/0091; H01L 33/20; H01L 33/24;
(Continued)

(56) References Cited

U.S. PATENT DOCUMENTS

| 10,181,500 B2 | 1/2019 | Kim |
| 10,340,419 B2 | 7/2019 | Kim et al. |

(Continued)

FOREIGN PATENT DOCUMENTS

| KR | 10-2017-0039062 A | 4/2017 |
| KR | 10-2017-0039064 A | 4/2017 |

(Continued)

OTHER PUBLICATIONS

Notice of Allowance issued in corresponding Korean Patent Application No. 10-2019-0116130 on Mar. 28, 2024, 7pp.

(Continued)

*Primary Examiner* — Matthew C Landau
*Assistant Examiner* — Dmitriy Yemelyanov
(74) *Attorney, Agent, or Firm* — Lewis Roca Rothgerber Christie LLP

(57) ABSTRACT

A display device may include: a substrate; first and second electrode on the substrate; light emitting element between the first and second electrodes; a barrier structure on the substrate and including a first surface, a second surface, and a third surface; a light conversion layer on the barrier structure; and a passivation layer on the light conversion layer. A first space defined by the second and third surfaces may be between the substrate and the barrier structure. A second space defined by the first and second surfaces may be between the barrier structure and the passivation layer. The first and second spaces may be alternately located in the first direction. The light emitting element may be in the first space. The light conversion layer may be in the at least one second space.

9 Claims, 13 Drawing Sheets

(51) Int. Cl.
*H01L 27/15* (2006.01)
*H01L 33/24* (2010.01)
*H01L 33/38* (2010.01)
*H01L 33/44* (2010.01)
*H01L 33/56* (2010.01)

(52) U.S. Cl.
CPC .............. *H01L 33/38* (2013.01); *H01L 33/44* (2013.01); *H01L 33/56* (2013.01); *G09G 2300/0452* (2013.01)

(58) Field of Classification Search
CPC ......... H01L 33/38; H01L 33/44; H01L 33/50; H01L 33/502; H01L 33/56; H01L 33/58; G09G 2300/0452; G09G 2300/0819; G09G 2300/0842; G09G 2300/0861; G09G 2320/0238; G09G 3/32; G09G 3/3233

See application file for complete search history.

(56) References Cited

U.S. PATENT DOCUMENTS

| | | |
|---|---|---|
| 10,566,318 B2 | 2/2020 | Lee et al. |
| 10,678,091 B2 | 6/2020 | Lee et al. |
| 2017/0090247 A1 | 3/2017 | Lee et al. |
| 2017/0092820 A1 | 3/2017 | Kim et al. |
| 2017/0162746 A1 | 6/2017 | Cha et al. |
| 2018/0012876 A1* | 1/2018 | Kim ...................... H01L 25/167 |
| 2018/0019369 A1* | 1/2018 | Cho ........................ H01L 33/38 |
| 2019/0181202 A1 | 6/2019 | Lim et al. |
| 2020/0091393 A1 | 3/2020 | Bae et al. |

FOREIGN PATENT DOCUMENTS

| | | |
|---|---|---|
| KR | 10-2017-0064775 A | 6/2017 |
| KR | 10-2018-0045887 A | 5/2018 |
| KR | 10-2018-0055021 A | 5/2018 |
| KR | 10-2018-0114439 A | 10/2018 |
| KR | 10-2019-0047592 A | 5/2019 |
| KR | 10-2019-0067296 A | 6/2019 |
| KR | 10-2019-0068814 A | 6/2019 |
| KR | 10-2019-0071274 A | 6/2019 |

OTHER PUBLICATIONS

International Search Report issued in International Application No. PCT/KR2020/012070, Dec. 9, 20202, 3pp.

* cited by examiner

DISPLAY DEVICE

CROSS-REFERENCE TO RELATED APPLICATION

This application is a divisional of U.S. patent application Ser. No. 16/857,000, filed Apr. 23, 2020, which claims priority to and the benefit of Korean patent application number 10-2019-0116130, filed on Sep. 20, 2019, the entire disclosure of each of which is incorporated herein by reference.

BACKGROUND

1. Field

Various embodiments of the present disclosure relate to a display device, and, for example, to a display device including a light emitting element.

2. Description of Related Art

A display device may use a light emitting element such as a light emitting diode as a light source of a pixel to display an image. The light emitting diode may maintain relatively suitable or satisfactory durability even under poor environmental conditions, and be excellent in terms of lifetime and luminance.

Recently, research on the technology of fabricating a light emitting diode using material having a high-reliability inorganic crystalline structure, and utilizing the light emitting diode on a panel of a light emitting display device to use it as a next generation pixel light source has become more active. As a part of such research, development of a light emitting display device using, as a light source of each pixel, a light emitting diode fabricated in a small size corresponding to the micro scale or the nano scale is ongoing.

SUMMARY

Various embodiments of the present disclosure are directed to a display device capable of improving the efficiency at which light emitted from a light emitting element is incident on a light conversion layer.

The effects of the subject matter of the present disclosure are not limited to the above-stated effects, and those skilled in the art will clearly understand other not explicitly mentioned effects from the accompanying claims.

An embodiment of the present disclosure may provide a display device including: a substrate; a first electrode and a second electrode on the substrate and spaced apart from each other in a first direction; a light emitting element between the first electrode and the second electrode; a barrier structure on the substrate and including a first surface, a second surface, and a third surface; a light conversion layer on the barrier structure; and a passivation layer on the light conversion layer. A first space defined by the second surface and the third surface may be between the substrate and the barrier structure. A second space defined by the first surface and the second surface may be between the barrier structure and the passivation layer. The first space and the second space may be alternately located in the first direction. The light emitting element may be in the first space. The light conversion layer may be in the at least one second space.

In an embodiment, the third surface may have a hole overlapping the light emitting element.

In an embodiment, the display device may further include a color filter on the light conversion layer.

In an embodiment, the light conversion layer may include a base resin and wavelength conversion particles dispersed in the base resin.

In an embodiment, the light conversion layer may further include light scattering particles dispersed in the base resin.

In an embodiment, the first surface may be closer to the substrate than is the third surface, and the first surface and the third surface may be alternately arranged in the first direction.

In an embodiment, the second surface may be between the first surface and the third surface and couple the first surface with the third surface.

In an embodiment, the first space may be sealed by the substrate, the barrier structure, and the passivation layer and filled with air.

In an embodiment, the display device may further include an anchored pattern in the first space. The light emitting element may be fixed between the substrate and the anchored pattern.

In an embodiment, the display device may further include a light shielding pattern located along the second surface in the second space in which the light conversion layer is not included. The light shielding pattern may include metal.

In an embodiment, the display device may further include a black matrix in the second space in which the light conversion layer is not included. The black matrix may be configured to absorb and block incident light.

An embodiment of the present disclosure may provide a display device including: a substrate; a first electrode and a second electrode on the substrate and spaced apart from each other in a first direction; a light emitting element between the first electrode and the second electrode; a light conversion layer on the substrate; and a barrier structure on the substrate and including a first surface, a second surface, and a third surface. A first space defined by the second surface and the third surface may be between the substrate and the barrier structure. A second space defined by the first surface and the second surface may be in the barrier structure. The first space and the second space may be alternately located in the first direction. The light conversion layer may be in the first space. The light emitting element may be in the at least one second space.

In an embodiment, the first surface may expose at least a portion of the first electrode and at least a portion of the second electrode, and have a first hole overlapping the light emitting element.

In an embodiment, the third surface may have a second hole overlapping the light conversion layer.

In an embodiment, the display device may further include a passivation layer on the barrier structure, and a color filter on the passivation layer.

In an embodiment, the light conversion layer may include a base resin, wavelength conversion particles dispersed in the base resin, and light scattering particles dispersed in the base resin.

In an embodiment, the first surface may be closer to the substrate than is the third surface, and the first surface and the third surface may be alternately arranged in the first direction.

In an embodiment, the second surface may be between the first surface and the third surface and couple the first surface with the third surface.

In an embodiment, the display device may further include a light shielding pattern located along the second surface in the second space in which the light emitting element is not included. The light shielding pattern may include metal.

In an embodiment, the display device may further include a black matrix overlapping the second space in which the light emitting element is not on the barrier structure. The black matrix may be configured to absorb and block incident light.

More details of various embodiments are included in the detailed descriptions and drawings.

BRIEF DESCRIPTION OF THE DRAWINGS

The accompanying drawings, together with the specification, illustrate embodiments of the subject matter of the present disclosure, and, together with the description, serve to explain principles of embodiments of the subject matter of the present disclosure.

DETAILED DESCRIPTION

Figure 1A:
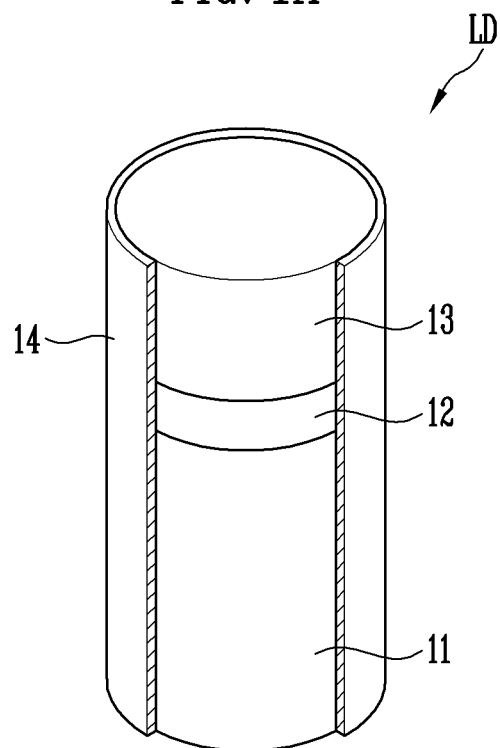
FIGS. 1A and 1B are perspective views illustrating a light emitting element in accordance with an embodiment of the present disclosure.

Features of the subject matter of the present disclosure, and methods for achieving the same will be clearer with reference to embodiments described herein below in more detail together with the accompanying drawings. The subject matter of the present disclosure may, however, be embodied in many different forms and should not be construed as being limited to the embodiments set forth herein. Rather, these embodiments are provided so that this disclosure will be thorough and complete and will fully convey the concept of the present disclosure to those skilled in the art, and the present disclosure will only be defined by the appended claims, and equivalents thereof.

It will be understood that when an element or a layer is referred to as being "on" another element or a layer, it can be directly on, connected to, or coupled to the other element or the layer, or one or more intervening elements or layers may be present. Like reference numerals refer to like elements throughout.

It will be understood that, although the terms "first", "second", etc. may be used herein to describe various elements, these elements should not be limited by these terms. These terms are only used to distinguish one element from another element. For instance, a first element discussed herein below could be termed a second element without departing from the spirit and scope of the present disclosure. In the present disclosure, the singular forms are intended to include the plural forms as well, unless the context clearly indicates otherwise.

Some elements which are not directly related to the features of the present disclosure in the drawings may be omitted to clearly explain the subject matter of the present disclosure. Furthermore, the sizes, ratios, etc. of some elements in the drawings may be slightly exaggerated. It should be noted that the same reference numerals are used to designate the same or similar elements throughout the drawings, and duplicative explanation thereof will not be repeated.

Hereinafter, embodiments of the present disclosure will be described in more detail with reference to the accompanying drawings.

Figure 1B:
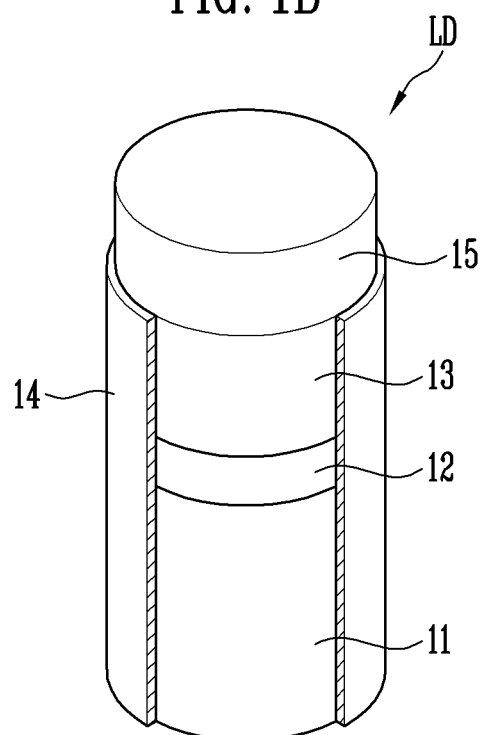

FIGS. 1A and 1B are perspective views illustrating a light emitting element LD in accordance with an embodiment of the present disclosure.

Referring to FIGS. 1A and 1B, the light emitting element LD in accordance with an embodiment of the present disclosure may include a first semiconductor layer 11, a second semiconductor layer 13, and an active layer 12 interposed between the first and second semiconductor layers 11 and 13. For example, the light emitting element LD may be implemented as a stack formed by successively stacking the first semiconductor layer 11, the active layer 12, and the second semiconductor layer 13.

In an embodiment of the present disclosure, the light emitting element LD may be provided in the form of a rod extending in one direction. If the direction in which the light emitting element LD extends is defined as a longitudinal direction, the light emitting element LD may have a first end EP1 and a second end EP2 with respect to the longitudinal direction.

In an embodiment, one of the first and second semiconductor layers 11 and 13 may be on the first end EP1, and the other of the first and second semiconductor layers 11 and 13 may be on the second end EP2. For example, the first semiconductor layer 11 may be on the first end EP1, and the second semiconductor layer 13 may be on the second end EP2.

In an embodiment of the present disclosure, the light emitting element LD may be provided in the form of a rod. Here, the term "rod type" embraces a rod-like shape and a bar-like shape such as a cylindrical shape and a prismatic shape extending in the longitudinal direction (e.g., to have an aspect ratio greater than 1). For example, the length of the light emitting element LD may be greater than the diameter thereof. However, the present disclosure is not limited thereto. For example, the light emitting element LD may be a light emitting element having a core-shell structure.

The light emitting element LD may be fabricated to have a small size having a diameter and/or length corresponding to, e.g., a micro-scale or nano-scale size. For example, the diameter of the light emitting element LD may be equal to or less than 600 nm, and the length of the light emitting element LD may be equal to or less than 4 μm. However, the size of the light emitting element LD is not limited thereto. For instance, the size of the light emitting element LD may be changed to meet requirements of the display device to which the light emitting element LD is applied.

The first semiconductor layer 11 may include, for example, at least one n-type semiconductor layer. For instance, the first semiconductor layer 11 may include a semiconductor layer which includes any one semiconductor material selected from InAlGaN, GaN, AlGaN, InGaN, AlN, and InN, and is doped with a first dopant such as Si, Ge, or Sn.

The material forming the first semiconductor layer 11 is not limited thereto, and the first semiconductor layer 11 may be formed of various other suitable materials.

The active layer 12 may be formed on the first semiconductor layer 11 and have a single or multiple quantum well structure. The active layer 12 may emit light having a wavelength in a range from 400 nm to 900 nm, and use a double heterostructure. In an embodiment of the present disclosure, a cladding layer doped with a dopant may be formed on and/or under the active layer 12. For example, the cladding layer may be formed of an ALGaN layer or an InALGaN layer. In an embodiment, material such as AlGaN or AlInGaN may also be used to form the active layer 12, and various other suitable materials may be used to form the active layer 12.

If an electric field having a set or predetermined voltage or more is applied to the opposite ends of the light emitting element LD, the light emitting element LD emits light by coupling of electron-hole pairs in the active layer 12. Because light emission of the light emitting element LD can be controlled based on the foregoing principle, the light emitting element LD may be used as a light source of various suitable light emitting devices as well as a pixel of the display device.

The second semiconductor layer 13 may be provided on the active layer 12 and include a semiconductor layer of a type (or kind) different from that of the first semiconductor layer 11. For example, the second semiconductor layer 13 may include at least one p-type semiconductor layer. For instance, the second semiconductor layer 13 may include a semiconductor layer which includes any one semiconductor material selected from InAlGaN, GaN, AlGaN, InGaN, AlN, and InN, and is doped with a second dopant such as Mg. The material forming the second semiconductor layer 13 is not limited thereto, and the second semiconductor layer 13 may be formed of various other suitable materials.

In an embodiment of the present disclosure, the light emitting element LD may not only include the first semiconductor layer 11, the active layer 12, and the second semiconductor layer 13, but may also include a fluorescent layer, another active layer, another semiconductor layer, and/or an electrode layer provided on and/or under each layer.

In an embodiment, the light emitting element LD may further include at least one electrode layer on one side (e.g., an upper surface) of the second semiconductor layer 13 or one side (e.g., a lower surface) of the first semiconductor layer 11. For example, as illustrated in FIG. 1B, the light emitting element LD may further include an electrode layer 15 on one side of the second semiconductor layer 13. The electrode layer 15 may be an ohmic contact electrode, but it is not limited thereto. Furthermore, the electrode layer 15 may include metal or a metal oxide. For example, chrome (Cr), titanium (Ti), aluminum (Al), gold (Au), nickel (Ni), ITO, and an oxide or alloy thereof may be used alone or in combination with each other. However, the present disclosure is not limited to this. In an embodiment, the electrode layer 15 may be substantially transparent or translucent.

Thereby, light generated from the light emitting element LD may be emitted to the outside after passing through the electrode layer 15.

The light emitting element LD may further include an insulating film 14. However, in an embodiment of the present disclosure, the insulating layer 14 may be omitted, or may be provided to cover only some of the first semiconductor layer 11, the active layer 12, and the second semiconductor layer 13. For example, the insulating film 14 may be provided on a portion of the light emitting element LD, other than the opposite ends thereof, so that the opposite ends of the light emitting element LD are exposed.

For the sake of explanation, FIGS. 1A and 1B illustrate the insulating layer 14 a portion of which has been removed. The entirety of the side surface of the light emitting element LD may be enclosed by the insulating layer 14.

In an embodiment of the present disclosure, the insulating layer 14 may include a transparent insulating material. For example, the insulating layer 14 may include at least one or more insulating materials among $SiO_2$, $Si_3N_4$, $Al_2O_3$, and $TiO_2$, but it is not limited thereto. In other words, various suitable materials having insulation properties may be employed.

The insulating layer 14 may prevent the active layer 12 from short-circuiting as a result of electrical contact with a conductive material except the first semiconductor 11 and the second semiconductor layer 13 (or reduce a likelihood or occurrence of such a short-circuit). As a result of the presence of the insulating layer 14, occurrence of a defect on the surface of the light emitting element LD may be minimized or reduced, whereby the lifetime and efficiency of the light emitting element LD may be improved. In the case where a plurality of light emitting elements LD are in close contact (e.g., direct or physical contact) with each other, the insulating layer 14 may prevent an undesired short-circuit from occurring between the light emitting elements LD (or may reduce a likelihood or occurrence of such a short-circuit).

The type (or kind), the structure, the shape, etc. of the light emitting element LD in accordance with an embodiment of the present disclosure may be changed in various suitable ways.

Figure 2:
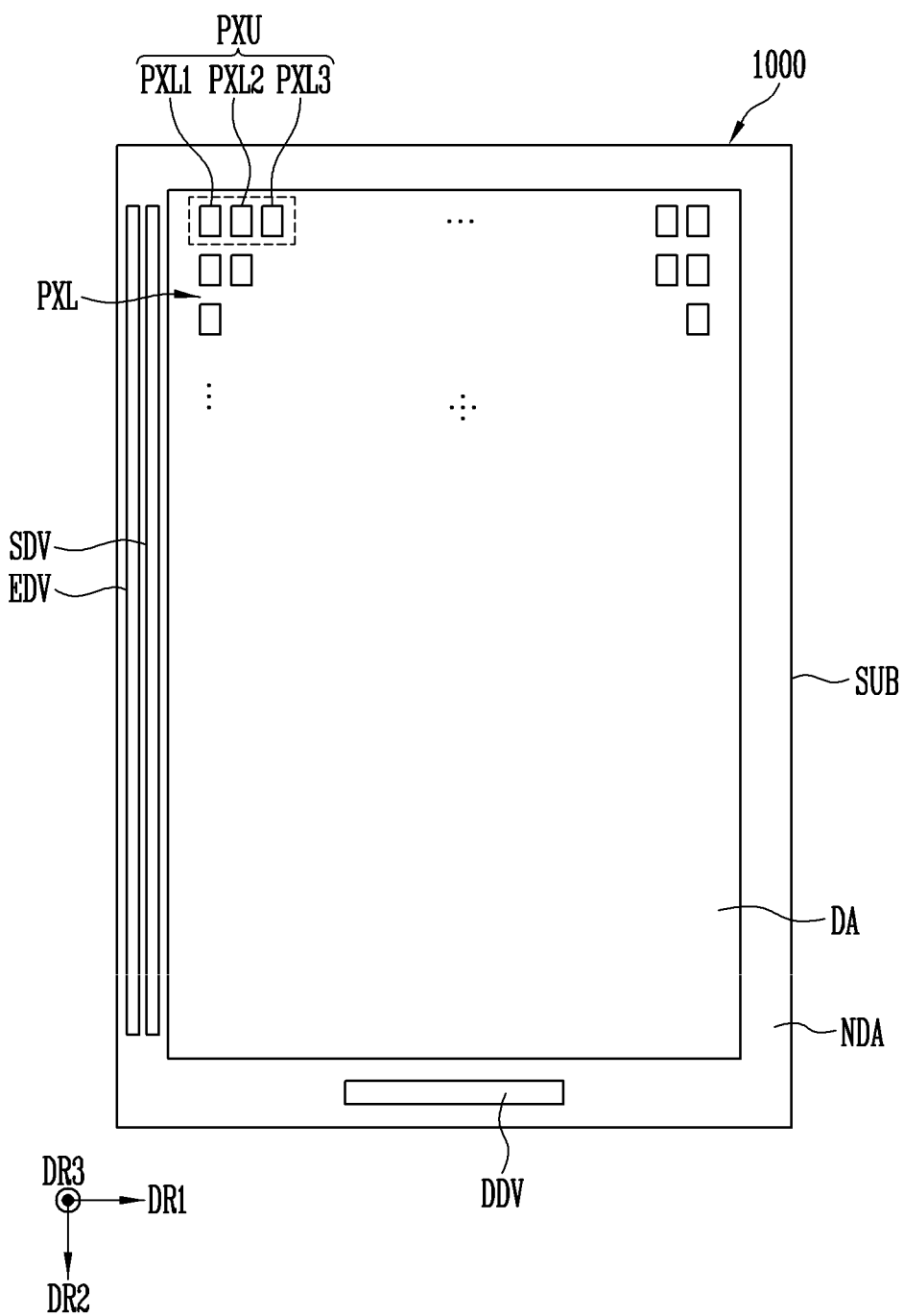
FIG. 2 is a plan view schematically illustrating a display device in accordance with an embodiment of the present disclosure.

FIG. 2 is a plan view schematically illustrating the display device 1000 in accordance with an embodiment of the present disclosure.

Referring to FIGS. 1A to 2, the display device 1000 may include a substrate SUB, and a plurality of pixels PXL provided on the substrate SUB. In more detail, the display device 1000 may include a display area DA configured to display an image, and a non-display area NDA formed in a set or predetermined area other than the display area DA.

The display area DA may be an area in which the pixels PXL are provided. The non-display area NDA may be an area in which drivers for driving the pixels PXL and various suitable lines for coupling the pixels PXL to the drivers are provided.

The display area DA may have various suitable shapes. For example, the display area DA may be provided in various suitable forms such as a closed polygon including sides formed of linear lines, a circle, an ellipse or the like including a side formed of a curved line, and a semicircle, a semi-ellipse or the like including sides formed of a linear line and a curved line.

In the case where the display area DA includes a plurality of areas, each area may be provided in various suitable forms such as a closed polygon including linear sides, and a semicircle, a semi-ellipse or the like including sides formed of a curved line. The surface areas of the plurality of areas may be the same as or different from each other.

In an embodiment of the present disclosure, there will be described an example in which the display area DA is provided with a single area having a rectangular shape including linear sides.

The non-display area NDA may be provided on at least one side of the display area DA. In an embodiment of the present disclosure, the non-display area NDA may enclose the display area DA.

The pixels PXL may be in the display area DA on the substrate SUB. Each of the pixels PXL may include at least one light emitting element LD configured to be driven in response to a corresponding scan signal and a corresponding data signal.

The pixels PXL each may include a light emitting element which emits white light and/or color light. Each pixel PXL may emit light having any one color selected from among red, green, and blue, and it is not limited thereto. For example, each pixel PXL may emit light having any one color selected from among cyan, magenta, yellow, and white.

In more detail, the pixels PXL may include a first pixel PXL1 configured to emit light having a first color, a second pixel PXL2 configured to emit light having a second color different from the first color, and a third pixel PXL3 configured to emit light having a third color different from the first color or the second color. At least one first pixel PXL1, at least one second pixel PXL2, and at least one third pixel PXL3 that are adjacent to each other may form one pixel unit PXU which may emit light having various suitable colors.

In an embodiment, the first pixel PXL1 may be a red pixel which emits red light, a second pixel PXL2 may be a green pixel which emits green light, and a third pixel PXL3 may be a blue light which emits blue light. In an embodiment, the first pixel PXL1, the second pixel PXL2, and the third pixel PXL3 may include, as light sources, a light emitting element related to the first color, a light emitting element related to the second color, and a light emitting element related to the third color, so that the pixels may respectively emit light having the first color, light having the second color, and light having the third color. In an embodiment, the first pixel PXL1, the second pixel PXL2, and the third pixel PXL3 may respectively include light emitting elements having the same or substantially the same color, and light conversion layers having different colors are on the respective light emitting elements so that the pixels may respectively emit light having the first color, light having the second color, and light having the third color.

However, the colors, the types (or kinds), and/or the number of pixels PXL that form each pixel unit PXU are not particularly limited.

The pixels PXL may be arranged in a matrix form having rows and columns extending in a first direction DR1 and a second direction DR2 intersecting the first direction DR1. However, the arrangement of the pixels PXL is not limited to a particular arrangement. In other words, the pixels PXL may be arranged in various suitable forms.

The drivers may provide signals to the pixels PXL through the lines, and thus, control the operation of the pixels PXL. In FIG. 2, the lines are omitted for the sake of explanation.

The drivers may include a scan driver SDV configured to provide scan signals to the pixels PXL through scan lines, an emission driver EDV configured to provide emission control signals to the pixels PXL through emission control lines, a data driver DDV configured to provide data signals to the pixels PXL through data lines, and a timing controller. The timing controller may control the scan driver SDV, the emission driver EDV, and the data driver DDV.

In an embodiment, each of the pixels PXL may be formed of an active pixel. However, the types (or kinds), structures, and/or driving schemes of the pixels PXL capable of being applied to the present disclosure are not particularly limited.

Figure 3A:
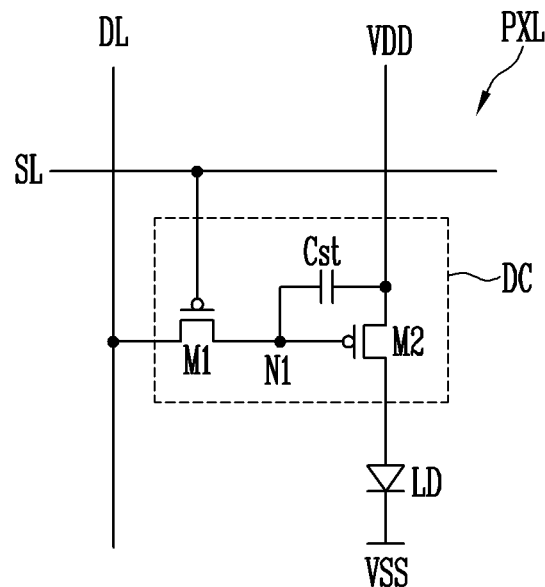
FIGS. 3A and 3B are circuit diagrams each illustrating a pixel in accordance with an embodiment of the present disclosure.
Figure 3B:
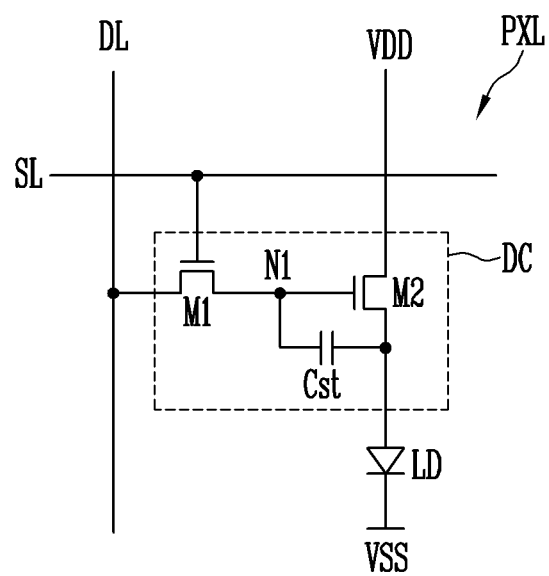

FIGS. 3A and 3B are circuit diagrams each illustrating a pixel in accordance with an embodiment of the present disclosure. For example, FIGS. 3A and 3B illustrate examples of a pixel that forms an active emission display panel.

Referring to FIG. 3A, each of the pixels PXL may include at least one light emitting element LD, and a pixel driving circuit DC which is coupled to the light emitting element LD and configured to drive the light emitting element LD.

A first electrode (e.g., an anode electrode) of the light emitting element LD may be coupled to a first driving power supply VDD via the pixel driving circuit DC. A second electrode (e.g., a cathode electrode) of the light emitting element LD may be coupled to a second driving power supply VSS.

The first driving power supply VDD and the second driving power supply VSS may have different potentials. For example, the second driving power supply VSS may have a potential lower than that of the first driving power supply VDD by a value equal to or greater than a threshold voltage of the light emitting element LD.

The light emitting element LD may emit light at a luminance corresponding to driving current which is controlled by the pixel driving circuit DC.

Although FIG. 3A illustrates an embodiment in which each of the pixels PXL includes only one light emitting element LD, the present disclosure is not limited thereto. For example, each of the pixels PXL may include a plurality of light emitting elements coupled in parallel and/or series to each other.

In an embodiment of the present disclosure, the pixel driving circuit DC may include a first transistor M1, a second transistor M2, and a storage capacitor Cst. The structure of the pixel driving circuit DC is not limited to that of the embodiment illustrated in FIG. 3A. In an embodiment, each of the pixels PXL may further include a pixel sensing circuit. The pixel sensing circuit may measure a driving current value of each of the pixels PXL, and transmit the driving current value to an external circuit (e.g., a timing controller) so that the pixel PXL may be compensated for.

The first transistor (switching transistor) M1 may include a first electrode coupled to a data line DL, and a second electrode coupled to a first node N1. Here, the first electrode and the second electrode of the first transistor M1 may be different electrodes. For example, if the first electrode is a source electrode, the second electrode is a drain electrode. A gate electrode of the first transistor M1 may be coupled to a scan line SL.

When a scan signal having a voltage (e.g., a gate-on voltage) capable of turning on the first transistor M1 is supplied from the scan line SL, the first transistor M1 is turned on to electrically couple the data line DL with the first node N1. Here, a data signal of a corresponding frame is supplied to the data line DL, whereby the data signal may be transmitted to the first node N1. The data signal transmitted to the first node N1 may be stored in the storage capacitor Cst.

The second transistor (driving transistor) M2 may include a first electrode coupled to the first driving power supply VDD, and a second electrode electrically coupled to a first electrode (e.g., an anode electrode) of the light emitting element LD. A gate electrode of the second transistor M2 may be coupled to the first node N1. As such, the second transistor M2 may control the amount of driving current to be supplied to the light emitting element LD in response to the voltage of the first node N1.

The storage capacitor Cst may include a first electrode coupled to the first driving power supply VDD, and a second electrode coupled to the first node N1. The storage capacitor Cst may be charged with a voltage corresponding to a data signal supplied to the first node N1, and maintain the charged voltage until a data signal of a subsequent frame is supplied.

For the sake of explanation, FIG. 3A illustrates a driving circuit DC having a relatively simple structure including the first transistor M1 configured to transmit a data signal to the pixel PXL, the storage capacitor Cst configured to store the data signal, and the second transistor M2 configured to supply driving current corresponding to the data signal to the light emitting element LD.

However, the present disclosure is not limited thereto, and the structure of the pixel circuit DC may be changed in various suitable ways. For example, the driving circuit DC may further include at least one transistor such as a transistor configured to compensate for the threshold voltage of the second transistor M2, a transistor configured to initialize the first node N1, and/or a transistor configured to control an emission time of the light emitting element LD, or other circuit elements such as a boosting capacitor for boosting the voltage of the first node N1.

Furthermore, although in FIG. 3A the transistors, e.g., the first and second transistors M1 and M2, included in the driving circuit DC have been illustrated as being formed of P-type transistors, the present disclosure is not limited to this. In other words, at least one of the first and second transistors M1 and M2 included in the driving circuit DC may be changed to an N-type transistor.

For example, referring to FIG. 3B, each of the first and second transistors M1 and M2 of the driving circuit DC may be formed of an N-type transistor. The configuration and operation of the driving circuit DC illustrated in FIG. 3B, other than a change in connection positions of some components due to a change in the type (or kind) of transistor, are similar to those of the driving circuit DC of FIG. 3A. Therefore, duplicative descriptions thereof will not be repeated here.

Figure 4:
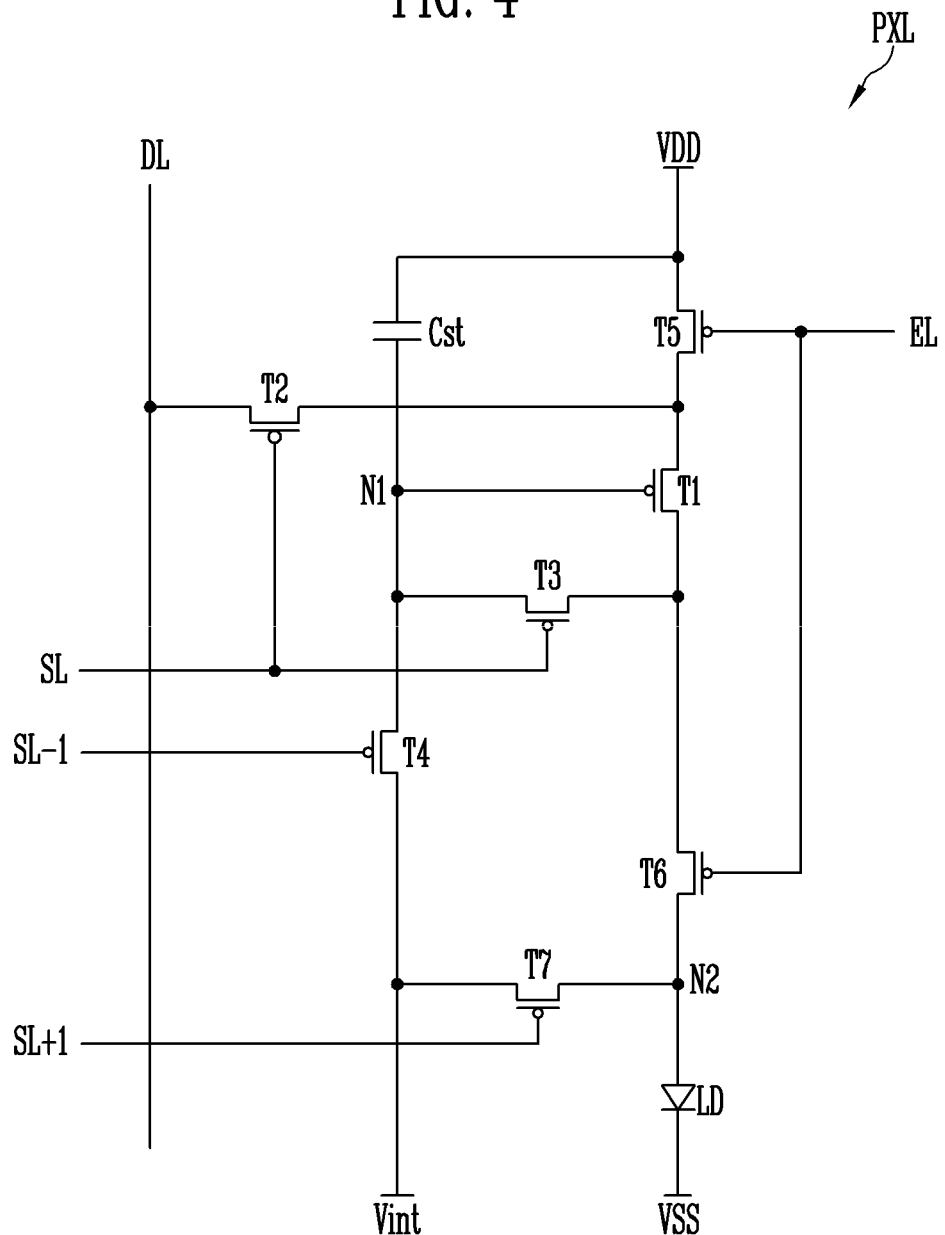
FIG. 4 is a circuit diagram illustrating a pixel in accordance with an embodiment of the present disclosure.

FIG. 4 is a circuit diagram illustrating a pixel in accordance with an embodiment of the present disclosure.

Referring to FIG. 4, each of the pixels PXL in accordance with an embodiment of the present disclosure may include a light emitting device LD, first to seventh transistors T1, T2, T3, T4, T5, T6, and T7, and a storage capacitor Cst.

A first electrode (e.g., an anode electrode) of the light emitting element LD may be coupled to the first transistor T1 via the sixth transistor T6. A second electrode (e.g., a cathode electrode) of the light emitting element LD may be coupled to a second driving power supply VSS. The light emitting element LD may emit light having a set or predetermined luminance corresponding to current supplied from the first transistor T1.

The first transistor (driving transistor) T1 may include a first electrode coupled to the first driving power supply VDD via the fifth transistor T5, and a second electrode coupled to a first electrode of the light emitting device LD via the sixth transistor T6. The first transistor T1 may control, in response to the voltage of the first node N1 that is a gate electrode thereof, current flowing from the first driving power supply VDD to the second driving power supply VSS via the light emitting element LD.

The second transistor (switching transistor) T2 may be coupled between a data line DL and the first electrode of the first transistor T1. A gate electrode of the second transistor T2 may be coupled to a scan line SL. When a scan signal having a gate-on voltage is supplied to the scan line SL, the second transistor T2 may be turned on so that the data line DL may be electrically coupled with the first electrode of the first transistor T1.

The third transistor T3 may be coupled between the second electrode of the first transistor T1 and the first node N1. A gate electrode of the third transistor T3 may be coupled to the scan line SL. When a scan signal having a gate-on voltage is supplied to the scan line SL, the third transistor T3 may be turned on so that the second electrode of the first transistor T1 may be electrically coupled with the first node N1.

The fourth transistor T4 may be coupled between the first node N1 and an initialization power supply Vint. A gate electrode of the fourth transistor T4 may be coupled to a scan line SL-1 of a preceding stage. When a scan signal having a gate-on voltage is supplied to the scan line SL-1 of the preceding stage, the fourth transistor T4 is turned on so that the voltage of the initialization power supply Vint may be supplied to the first node N1. The initialization power supply Vint may be set to a voltage lower than that of a data signal.

The fifth transistor T5 may be coupled between the first driving power supply VDD and the first electrode of the first transistor T1. A gate electrode of the fifth transistor T5 may be coupled to an emission control line EL. The fifth transistor T5 may be turned on when an emission control signal having a gate-on voltage is supplied to the emission control line EL, and may be turned off in other cases.

The sixth transistor T6 is coupled between the second electrode of the first transistor T1 and the first electrode of the light emitting element LD, together with a node N2 between the sixth transistor T6 and the first electrode of the light emitting element LD. A gate electrode of the sixth transistor T6 may be coupled to the emission control line EL. The sixth transistor T6 may be turned on when an emission control signal having a gate-on voltage is supplied to the emission control line EL, and may be turned off in other cases.

The seventh transistor T7 may be coupled between the initialization power supply Vint and the first electrode of the light emitting element LD. A gate electrode of the seventh transistor T7 may be coupled to a scan line SL+1 of a subsequent stage. When a scan signal having a gate-on voltage is supplied to the scan line SL+1 of the subsequent stage, the seventh transistor T7 may be turned on so that the voltage of the initialization power supply Vint may be supplied to the first electrode of light emitting element LD.

The storage capacitor Cst may be coupled between the first driving power supply VDD and the first node N1. The storage capacitor Cst may store a voltage corresponding both to a data signal and to a threshold voltage of the first transistor T1.

Although in FIG. 4 the transistors, e.g., the first to seventh transistors T1, T2, T3, T4, T5, T6, and T7, included in the driving circuit DC have been illustrated as being formed of P-type transistors, the present disclosure is not limited to this. For example, at least one of the first to seventh transistors T1, T2, T3, T4, T5, T6, and T7 may be changed to an N-type transistor.

Figure 5:
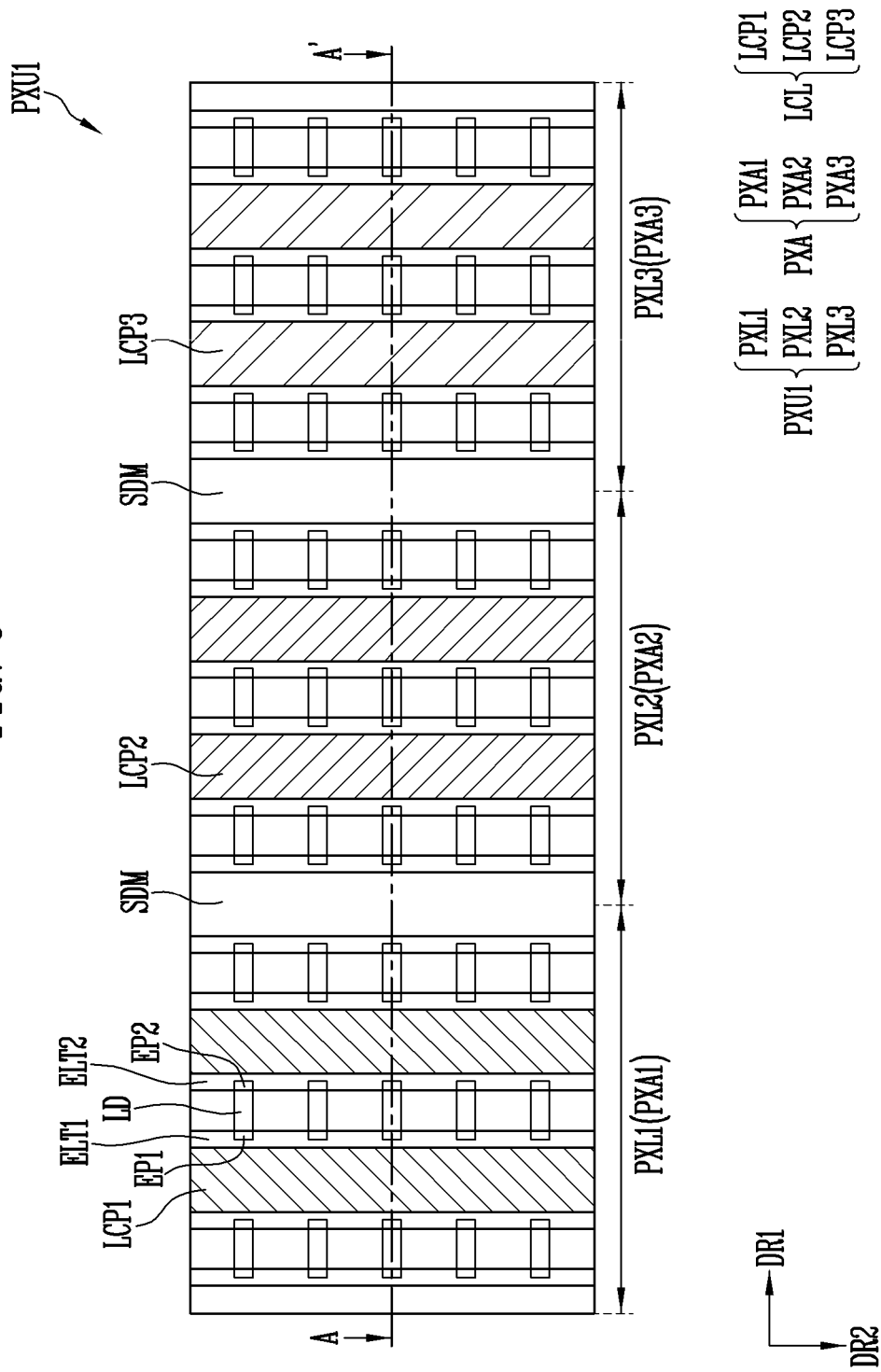
FIG. 5 is a plan view illustrating a pixel unit in accordance with an embodiment of the present disclosure.
Figure 6:
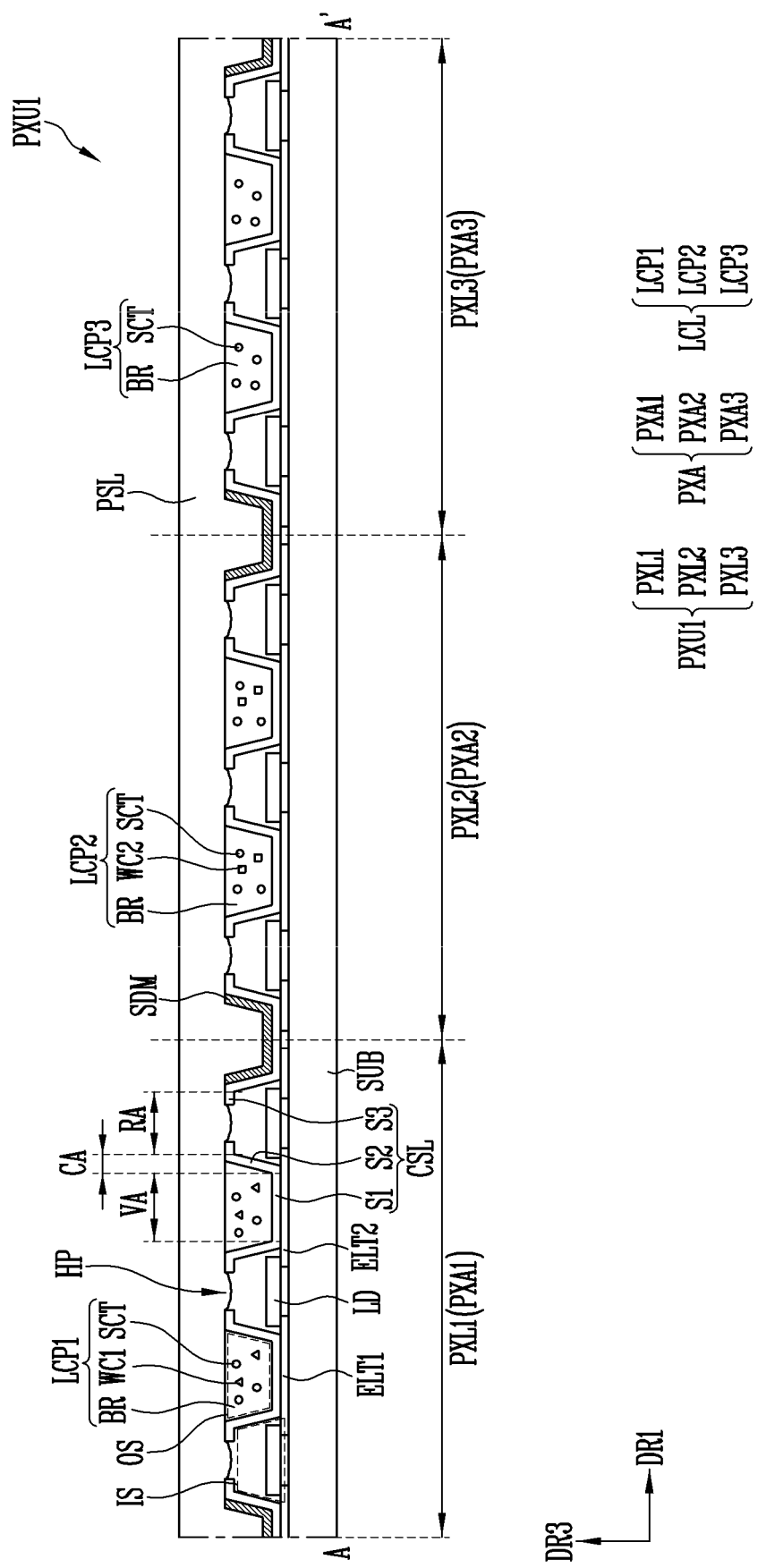
FIG. 6 is a schematic sectional view illustrating the pixel unit in accordance with an embodiment, taken along line A-A' of FIG. 5.

FIG. 5 is a plan view illustrating a pixel unit in accordance with an embodiment of the present disclosure. FIG. 6 is a schematic sectional view illustrating the pixel unit, taken along line A-A' of FIG. 5.

Although for the sake of explanation each electrode is simply illustrated as being formed of a single electrode layer, the present disclosure is not limited thereto. In an embodiment of the present disclosure, the words "components are provided and/or formed on the same layer" may mean that the components are formed through the same process.

Although for the sake of explanation FIG. 5 illustrates that a plurality of light emitting elements LD are arranged in the first direction DR1, the arrangement of the light emitting elements LD is not limited thereto. For example, the light emitting elements LD may be arranged in a diagonal direction between the first and second electrodes ELT1 and ELT2.

Referring to FIGS. 1A, 5, and 6, the display device in accordance with an embodiment may include a substrate SUB, a first electrode ELT1, a second electrode ELT2, a light emitting element LD, a barrier structure CSL, a light conversion layer LCL, a light shielding pattern SDM, and a passivation layer PSL.

The substrate SUB may be a rigid substrate or a flexible substrate, and the material or properties thereof are not particularly limited. For example, the substrate SUB may be a rigid substrate made of glass or reinforced glass, or a flexible substrate formed of a thin film made of plastic or metal. Furthermore, the substrate SUB may be a transparent substrate, but it is not limited thereto. For instance, the substrate SUB may be a translucent substrate, an opaque substrate, or a reflective substrate.

The substrate SUB may be sectioned into first to third pixel areas PXA1, PXA2, and PXA3 to form pixel area PXA. The first pixel area PXA1 may be an area in which the first pixel PXL1 is located. The second pixel area PXA2 may be an area in which the second pixel PXL2 is located. The third pixel area PXA3 may be an area in which the third pixel PXL3 is located. The first to third pixels PXL1, PXL2, and PXL3 may be successively arranged in the first direction DR1 in a pixel unit PXU1. Hence, the first to third pixel areas PXA1, PXA2, and PXA3 may also be successively arranged in the first direction DR1.

The first electrode ELT1 and the second electrode ELT2 may be on the substrate SUB. The first electrode ELT1 and the second electrode ELT2 may be on each of the pixel areas PXA of the substrate SUB. As illustrated in FIG. 5, the first electrode ELT1 and the second electrode ELT2 may be alternately in the first direction DR1. In other words, the first electrode ELT1 and the second electrode ELT2 may be on the substrate SUB at positions spaced apart from each other in the first direction DR1 with at least one light emitting element LD therebetween. The first electrode ELT1 and the second electrode ELT2 may extend in the second direction DR2.

In an embodiment, the first electrode ELT1 may be electrically coupled to a first end EP1 of each light emitting diode LD. The second electrode ELT2 may be electrically coupled to a second end EP2 of each light emitting diode LD.

The first electrode ELT1 and the second electrode ELT2 may be on the same plane and have the same or substantially the same height. If the first electrode ELT1 and the second electrode ELT2 have the same or substantially the same height, each light emitting element LD may be more reliably coupled to the first electrode ELT1 and the second electrode ELT2.

The first electrode ELT1 and the second electrode ELT2 may be formed of conductive material. The conductive material may include metal, for example, Ag, Mg, Al, Pt, Pd, Au, Ni, Nd, Ir, Cr, Ti, and an alloy thereof.

Each of the first electrode ELT1 and the second electrode ELT2 may have a single-layer structure, but the present disclosure is not limited thereto. For example, each of the first electrode ELT1 and the second electrode ELT2 may have a multi-layer structure. For example, each of the first electrode ELT1 and the second electrode ELT2 may further include a capping layer formed of a transparent conductive material. The capping layer may be located to cover the first electrode ELT1 and the second electrode ELT2 so that the first electrode ELT1 and the second electrode ELT2 to prevent or reduce damage during a process of manufacturing the display device.

The material of the first electrode ELT1 and the second electrode ELT2 is not limited to the above-mentioned materials. For example, the first electrode ELT1 and the second electrode ELT2 may be made of conductive material having a set or predetermined reflectivity. In the case where the first electrode ELT1 and the second electrode ELT2 are made of conductive material having a set or predetermined reflectivity, light emitted from the opposite ends EP1 and EP2 of the light emitting element LD may travel in a direction (e.g., a third direction DR3) in which an image is displayed. In other words, the light output efficiency of the display device may be improved.

Any one of the first and second electrodes ELT1 and ELT2 may be an anode electrode, and the other may be a cathode electrode. For example, the first electrode ELT1 may be a cathode electrode, and the second electrode ELT2 may be an anode electrode. However, the present disclosure is not limited thereto, and the first electrode ELT1 may be an anode electrode while the second electrode ELT2 may be a cathode electrode.

Although for the sake of explanation the first and second electrodes ELT1 and ELT2 are illustrated as being directly provided on the substrate SUB, the present disclosure is not limited thereto. For example, a component (e.g., a pixel circuit layer) for allowing the display device to be driven as a passive matrix or an active matrix may be further provided between the substrate SUB and the first and second electrodes ELT1 and ELT2.

The first electrode ELT1 and the second electrode ELT2 may provide driving signals for driving the corresponding light emitting elements LD. For example, referring also to FIG. 3A, the first electrode ELT1 and the second electrode ELT2 may be electrically coupled with any one selected from the driving circuit DC and the second driving power supply VSS. The first electrode ELT1 may be electrically coupled with the second driving power supply VSS. The second electrode ELT2 may be electrically coupled with the driving circuit DC. The first electrode ELT1 and the second electrode ELT2 may be respectively coupled to the first end EP1 and the second end EP2 of the light emitting element LD so that the driving signal may be provided to the light emitting element LD. The light emitting element LD may emit light having a set or predetermined luminance corresponding to driving current provided from the driving circuit DC.

Although for the sake of explanation FIGS. 5 and 6 illustrate that two first electrodes ELT1 and two second electrodes ELT2 are in each pixel area PXA, the numbers of first electrodes ELT1 and second electrodes ELT2 that are in each pixel PXA may be changed, as needed or desired.

The light emitting element LD may be provided on the substrate SUB and, for example, between the first electrode ELT1 and the second electrode ELT2. As described herein above, the first end EP1 of the light emitting element LD may come into contact (e.g., electrical, direct, or physical contact) with any one selected from the first electrode ELT1 and the second electrode ELT2. The second end EP2 may come into contact (e.g., electrical, direct, or physical contact) with the other electrode of the first electrode ELT1 and the second electrode ELT2. The light emitting element LD may receive driving current from the first electrode EL1 and the second electrode ELT2 and emit light having a set or predetermined luminance corresponding to the provided driving current.

As described herein above, for example, the light emitting elements LD may be blue light emitting elements which emit light having the same or substantially the same color (e.g., blue). However, the present disclosure is not limited thereto. The light emitting elements LD may be light emitting elements which emit light having different colors (e.g., red, green, and blue).

The barrier structure CSL may be provided on the overall area of the substrate SUB. The barrier structure CSL may be with an overall uniform or substantially uniform thickness. In an embodiment, the thickness of the barrier structure CSL may be 1 µm or less, but the present disclosure is not limited thereto.

The barrier structure CSL may be an inorganic layer including an inorganic material. For example, the barrier structure CSL may be formed of any one selected from silicon nitride SiNx, silicon oxide SiOx, and silicon oxynitride SiOxNy. In an embodiment, the barrier structure CSL may include an inorganic layer including silicon nitride SiNx.

The barrier structure CSL may be divided into a concave area VA, a convex area RA, and a connection area CA which couples the concave area VA with the convex area RA. In an embodiment, the concave area VA and the convex area RA may be alternately defined in the first direction DR1. The connection area CA may be defined between each concave area VA and the corresponding convex area RA.

The barrier structure CSL may be formed of a first surface S1, a second surface S2, and a third surface S3. The first surface S1 may be a surface in the concave area VA. The second surface S2 may be a surface in the connection area CA. The third surface S3 may be a surface in the convex area RA. The first surface S1, the second surface S2, and the third surface S3 may be integrally coupled with each other.

The first surface S1 may be a lower surface of the barrier structure CSL and be a surface adjacent to the substrate SUB. In an embodiment, the first surface S1 may come into contact (e.g., electrical, direct, or physical contact) with the first electrode ELT1 and the second electrode ELT2.

The second surface S2 may be a sidewall of the barrier structure SCL and be a surface which encloses sides of the light conversion layer LCL and the light shielding pattern SDM, which will be described herein below. The first surface S1 and the third surface S3 of the barrier structure CSL may be coupled to each other by the second surface S2.

The second surface S2 may be oriented at an angle to the first surface S1. In an embodiment, an obtuse angle formed between the first surface S1 and the second surface S2 may be greater than 90° and less than 120°. However, the present disclosure is not limited thereto, and the obtuse angle formed between the first surface S1 and the second surface S2 may be greater than 120° depending on the process of forming the barrier structure CSL.

The third surface S3 may be an upper surface of the barrier structure CSL and be a surface spaced apart from the substrate SUB by a distance greater than is the first surface S1. A first space IS defined by the substrate SUB, the second surface S2, and the third surface S3 may be formed between the barrier structure CSL and the substrate SUB.

Portions of the first and second electrodes ELT1 and ELT2 and the light emitting element LD may be in the first space IS defined between the barrier structure CSL and the substrate SUB. In an embodiment, the first space IS may be sealed by the substrate SUB, the barrier structure CSL, and the passivation layer PSL and filled with air, but the present disclosure is not limited thereto. For example, the first space IS may be filled with other materials.

The third surface S3 may include a hole HP. The hole HP may be an insert hole (e.g., a contact hole) through which the light emitting element LD is inserted into the first space IS between the substrate SUB and the barrier structure CSL. At least a portion of the hole HP may overlap with the light emitting element LD with respect to the third direction DR3.

A second space OS may be formed between the barrier structure CSL and the passivation layer PSL. In more detail, the second space OS may be space defined by the first surface S1 and the second surface S2 of the barrier structure CSL. The light conversion layer LCL to be described herein below may be in the second space OS. The first space IS and the second space OS may be alternately located in the first direction DR1.

The light conversion layer LCL may be provided on the substrate SUB. The light conversion layer LCL may include a first wavelength conversion pattern LCP1, a second wavelength conversion pattern LCP2, and a light scattering pattern LCP3. The first wavelength conversion pattern LCP1 may be in the first pixel area PXA1. The second wavelength conversion pattern LCP2 may be in the second pixel area PXA2. The light scattering pattern LCP3 may be in the third pixel area PXA3.

As illustrated in FIG. 5, the first wavelength conversion pattern LCP1, the second wavelength conversion pattern LCP2, and the light scattering pattern LCP3 may be spaced apart from each other in the first direction DR1 and extend in the second direction DR2.

The light conversion layer LCL may be formed in the second space OS defined by the first surface S1 and the second surface S2 of the barrier structure CSL. The shape of the light conversion layer LCL may be determined depending on the shape of the barrier structure CSL.

The first wavelength conversion pattern LCP1, the second wavelength conversion pattern LCP2, and the light scattering pattern LCP3 each may include base resin BR, and various suitable particles dispersed in the base resin BR. In more detail, the first wavelength conversion pattern LCP1 may include first wavelength conversion particles WC1 dispersed in the base resin BR. The second wavelength conversion pattern LCP2 may include second wavelength conversion particles WC2 dispersed in the base resin BR. The light scattering pattern LCP3 may include scattering particles SCT dispersed in the base resin BR. The first wavelength conversion pattern LCP1 and the second wavelength conversion pattern LCP2 each may further include scattering particles SCT dispersed in the base resin BR.

The material of the base resin BR is not particularly limited so long as it is a material having high light transmissivity and excellent dispersion characteristics for the first wavelength conversion particles WC1, the second wavelength conversion particles WC2, and the scattering particles SCT. For example, the base resin BR may include an organic material such as epoxy resin, acrylic resin, cardo resin, and/or imide resin.

The first wavelength conversion particles WC1 of the first wavelength conversion pattern LCP1 and the second wavelength conversion particles WC2 of the second wavelength conversion pattern LCP2 may convert a peak wavelength of incident light into another set or specific peak wavelength. In other words, the first wavelength conversion particles WC1 and the second wavelength conversion particles WC2 may convert the color of incident light.

For example, the first wavelength conversion particles WC1 may convert blue light provided from the light emitting element LD into red light and emit the red light. The second wavelength conversion particles WC2 may convert blue light provided from the light emitting element LD into green light and emit the green light. In other words, the first pixel area PXA1 in which the first wavelength conversion pattern LCP1 is located may be an area which emits red light. The second pixel area PXA2 in which the second wavelength conversion pattern LCP2 is located may be an area which emits green light.

Examples of the first wavelength conversion particles WC1 and the second wavelength conversion particles WC2 may include quantum dots, quantum rods, fluorescent substances, etc. A quantum dot may be particle material which emits light having a set or specific wavelength while an electron makes a transition from the conduction band to the valence band.

The quantum dot may be a semiconductor nanocrystal material. The quantum dot may have a set or specific bandgap depending on the composition and the size thereof, and thus, absorb light and then emit light having an intrinsic wavelength. Examples of a semiconductor nanocrystal of quantum dot may include a group IV nanocrystal, a group II-VI compound nanocrystal, a group III-V compound nanocrystal, a group IV-VI nanocrystal, and a combination thereof.

For instance, examples of the group IV nanocrystal may include silicon (Si), germanium (Ge), and a binary compound such as silicon carbide (SiC) and silicon-germanium (SiGe), but the present disclosure is not limited thereto.

Examples of the group II-VI compound nanocrystal may include binary compounds such as CdSe, CdTe, ZnS, ZnSe, ZnTe, ZnO, HgS, HgSe, HgTe, MgSe, MgS, and a mixture thereof, ternary compounds such as CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and a mixture thereof, and quanternary compounds such as HgZnTeS, CdZnSeS, CdZnSeTe, CdZnSTe, CdHgSeS, CdHgSeTe, CdHgSTe, HgZnSeS, HgZnSeTe, HgZnSTe, and a mixture thereof. However, the present disclosure is not limited thereto.

Examples of the group III-V compound nanocrystal may include binary compounds such as GaN, GaP, GaAs, GaSb, AlN, AlP, AlAs, AlSb, InN, InP, InAs, InSb, and a mixture thereof, ternary compounds such as GaNP, GaNAs, GaNSb, GaPAs, GaPSb, AlNP, AlNAs, AlNSb, AlPAs, AlPSb, InNP, InNAs, InNSb, InPAs, InPSb, GaAlNP, and a mixture thereof, and quanternary compounds such as GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and a mixture thereof. However, the present disclosure is not limited thereto.

Examples of the group IV-VI nanocrystal may include binary compounds such as SnS, SnSe, SnTe, PbS, PbSe, PbTe, and a mixture thereof, ternary compounds such as SnSeS, SnSeTe, SnSTe, PbSeS, PbSeTe, PbSTe, SnPbS, SnPbSe, SnPbTe, and a mixture thereof, and quanternary compounds such as SnPbSSe, SnPbSeTe, SnPbSTe, and a mixture thereof. However, the present disclosure is not limited thereto.

The quantum dot may have any suitable shape which is generally used in the art, and is not particularly limited. For example, a spherical, pyramid-shaped, multi-arm shaped, or cuboid nanoparticle, nanotube, nanowire, nanofiber, and/or nanoplate particle may be used. The binary compound, the ternary compound, and/or the quaternary compound may be present in particles at a substantially uniform concentration, or may be present in the same particles with different concentration distributions.

The quantum dot may have a core-shell structure including a core having the above-mentioned nanocrystal, and a shell which encloses the core. An interface between the core and the shell may have a concentration gradient in which the concentration of elements that are present in the shell decreases in a direction from the surface of the particle to the center of the particle. The shell of the quantum dot may function as a protective layer to prevent or reduce chemical changes to the core so that semiconductor characteristics may be retained, and/or may function as a charging layer for assigning electrophoresis characteristics to the quantum dot. The shell may have a single-layer structure or a multi-layer structure. Examples of the shell of the quantum dot may include metallic or nonmetallic oxide, a semiconductor compound, or a combination thereof.

For instance, although examples of the metallic or nonmetallic oxide may include binary compounds such as $SiO_2$, $Al_2O_3$, $TiO_2$, $ZnO$, $MnO$, $Mn_2O_3$, $Mn_3O_4$, $CuO$, $FeO$, $Fe_2O_3$, $Fe_3O_4$, $CoO$, $Co_3O_4$, and/or $NiO$, and/or ternary compounds such as $MgAl_2O_4$, $CoFe_2O_4$, $NiFe_2O_4$, and/or $CoMn_2O_4$, the present disclosure is not limited thereto.

Furthermore, although examples of the semiconductor compound may include CdS, CdSe, CdTe, ZnS, ZnSe, ZnTe, ZnSeS, GaAs, GaP, GaSb, HgS, HgSe, HgTe, InAs, InP, InSb, AlAs, AlP, and AlSb, the present disclosure is not limited thereto.

Light emitted from the above-mentioned quantum dot may have a full width at half maximum (FWHM) of an emission wavelength spectrum that is approximately 45 nm or less. Thereby, the purity and the reproducibility of a color expressed by the display device may be improved. Furthermore, light emitted from the quantum dot may be emitted in various directions regardless of a direction of incident light. Therefore, the side visibility of the display device may be improved.

The first wavelength conversion particles WC1 and the second wavelength conversion particles WC2 may be formed of quantum dots. In this case, the diameter of a quantum dot that forms each first wavelength conversion particle WC1 may be greater than that of a quantum dot that forms each second wavelength conversion particle WC2. For example, the diameter of the quantum dot that forms the first wavelength conversion particle WC1 may range from approximately 55 Å to approximately 65 Å, and the diameter of the quantum dot that forms the second wavelength conversion particle WC2 may range from approximately 40 Å to approximately 55 Å. However, the present disclosure is not limited thereto.

The light scattering pattern LCP3 may include scattering particles SCT. Furthermore, as described herein above, the first wavelength conversion pattern LCP1 and the second wavelength conversion pattern LCP2 each may further include scattering particles SCT.

The scattering particles SCT may have a refractive index different from that of the base resin BR and form an optical interface with the base resin BR. The material of each scattering particle SCT is not particularly limited, so long as it may scatter at least some of transmitted light. For example, the scattering particle SCT may be made of an oxide particle such as titanium oxide ($TiO_2$), zirconium oxide ($ZrO_2$), aluminum oxide ($Al_2O_3$), indium oxide ($In_2O_3$), zinc oxide (ZnO), tin oxide ($SnO_2$), or silica.

The scattering particle SCT may scatter light in random directions regardless of a direction of incident light without substantially converting the wavelength of light passing through the light scattering pattern LCP3. Thereby, the side visibility of the display device may be enhanced.

The light shielding pattern SDM may be provided on the substrate SUB. As illustrated in FIG. 5, a plurality of light shielding patterns SDM may be spaced apart from each other in the first direction DR1 and extend in the second direction DR2. Each light shielding pattern SDM may be located along a boundary between the corresponding pixel areas PXA. In other words, the light shielding pattern SDM may be between the first wavelength conversion pattern LCP1 and the second wavelength conversion pattern LCP2, between the second wavelength conversion pattern LCP2 and the light scattering pattern LCP3, or between the light scattering pattern LCP3 and the first wavelength conversion pattern LCP1.

The light shielding pattern SDM may be in the second space OS of the barrier structure CSL that is defined by the first surface S1 and the second surface S2 that are in the boundary between the corresponding pixel areas PXA.

The light shielding pattern SDM may include light shielding material capable of blocking or reducing transmission of light. Each light shielding pattern SDM may be between the corresponding pixel areas PXA, thus preventing or reducing a light leakage phenomenon or a color mixing phenomenon between adjacent pixels. Furthermore, the light shielding pattern SDM may include metal or material having high reflectivity so that the light output efficiency of the display device may be enhanced.

For example, in the case where light emitted from the light emitting element LD in the first pixel area PXA1 travels toward the second pixel area PXA2 that is an adjacent pixel area, the light shielding pattern SDM between the first pixel area PXA1 and the second pixel area PXA2 may block or reduce the amount of the light that travels toward the second pixel area PXA2. Furthermore, the light shielding pattern SDM may reflect the light that travels toward the second pixel area PXA2 so that the light travels back toward the first pixel area PXA1. Light that is reflected toward the first pixel area XPA1 may be emitted out, in the third direction DR3 that is the display direction, by a metal layer (e.g., the first and second electrode ELT1 and ELT2) provided in the first pixel area PXA1. Hence, the light output efficiency of the first pixel area PXA1 may be enhanced.

The passivation layer PSL may be provided on the overall area of the substrate SUB. The passivation layer PSL may include an organic insulating layer formed of an organic material or an inorganic insulating layer formed of an inorganic material.

The passivation layer PSL may cover the light conversion layer LCL. In other words, the passivation layer PSL may cover the upper surfaces of the first wavelength conversion pattern LCP1, the second wavelength conversion pattern LCP2, and the light scattering pattern LCP3. The first wavelength conversion pattern LCP1, the second wavelength conversion pattern LCP2, and the light scattering pattern LCP3 may be sealed by the barrier structure CSL and the passivation layer PSL. The sealing structure by the barrier structure CSL and the passivation layer PSL may prevent or reduce deterioration of the first wavelength conversion particles WC1 in the first wavelength conversion pattern LCP1 or the first wavelength conversion particles WC2 in the second wavelength conversion pattern LCP2.

In an embodiment, the passivation layer PSL may include a protrusion formed in an area in which the passivation layer PSL overlaps with the holes HP formed in the third surface S3 of the barrier structure CSL. The protrusion of the passivation layer PSL may protrude toward the substrate SUB so that at least a portion of the hole HP may be filled with the protrusion.

As described herein above, the light emitting element LD may receive a driving signal from the first electrode ELT1 and the second electrode ELT2 and emit light in response to the driving signal. Light emitted from the light emitting element LD may be incident on the light conversion layer LCL in each pixel area PXA and travel in random directions by the internal particles of the light conversion layer LCL. Rays of light that travel in directions other than the third direction DR3 may be reflected by the first electrode ELT1, the second electrode ELT2, and the light shielding pattern SDM that are on the substrate SUB, and thus travel in the third direction DR3.

Figure 7:
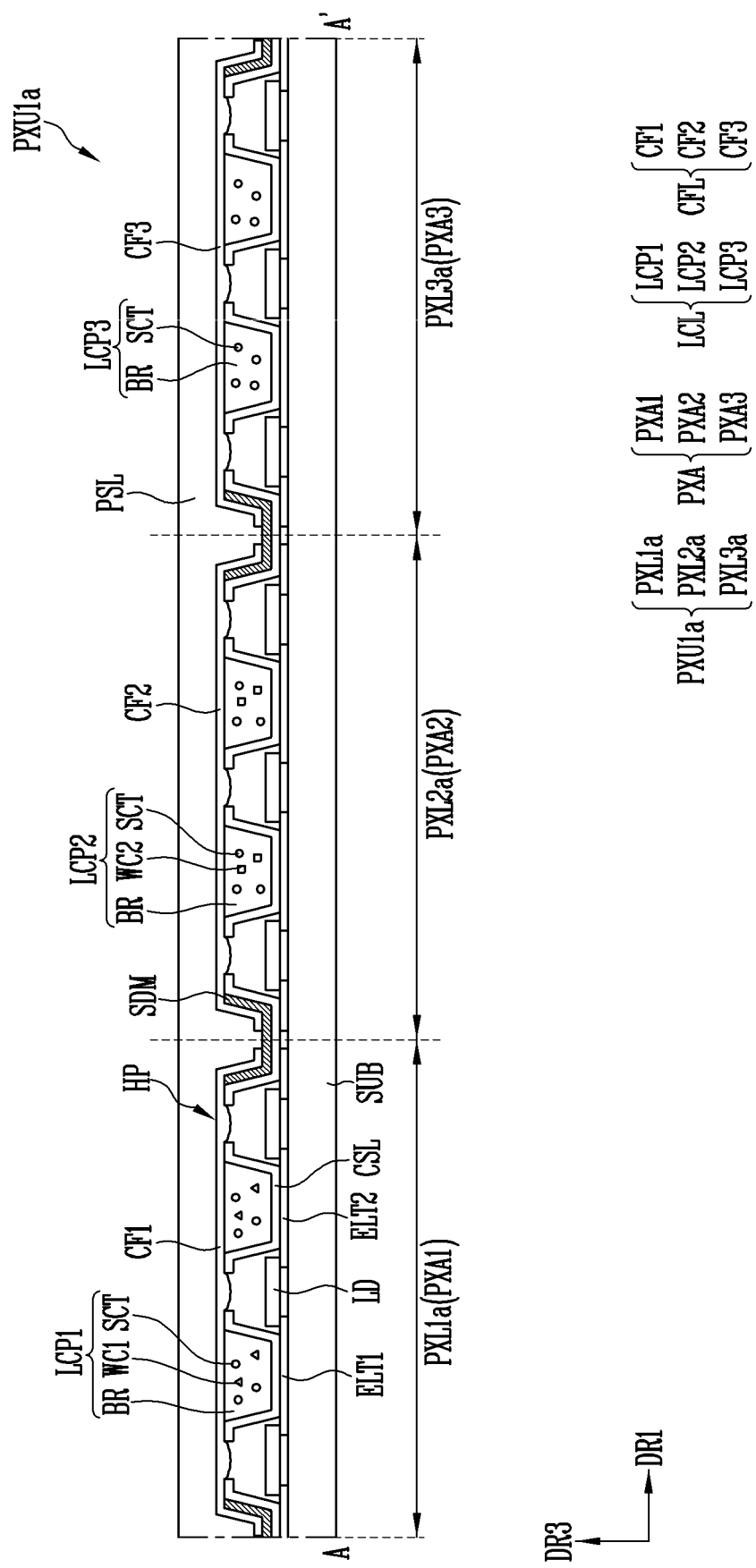
FIGS. 7 to 9 are sectional views of a pixel unit in accordance with various embodiments, corresponding to line A-A' of FIG. 5.
Figure 8:
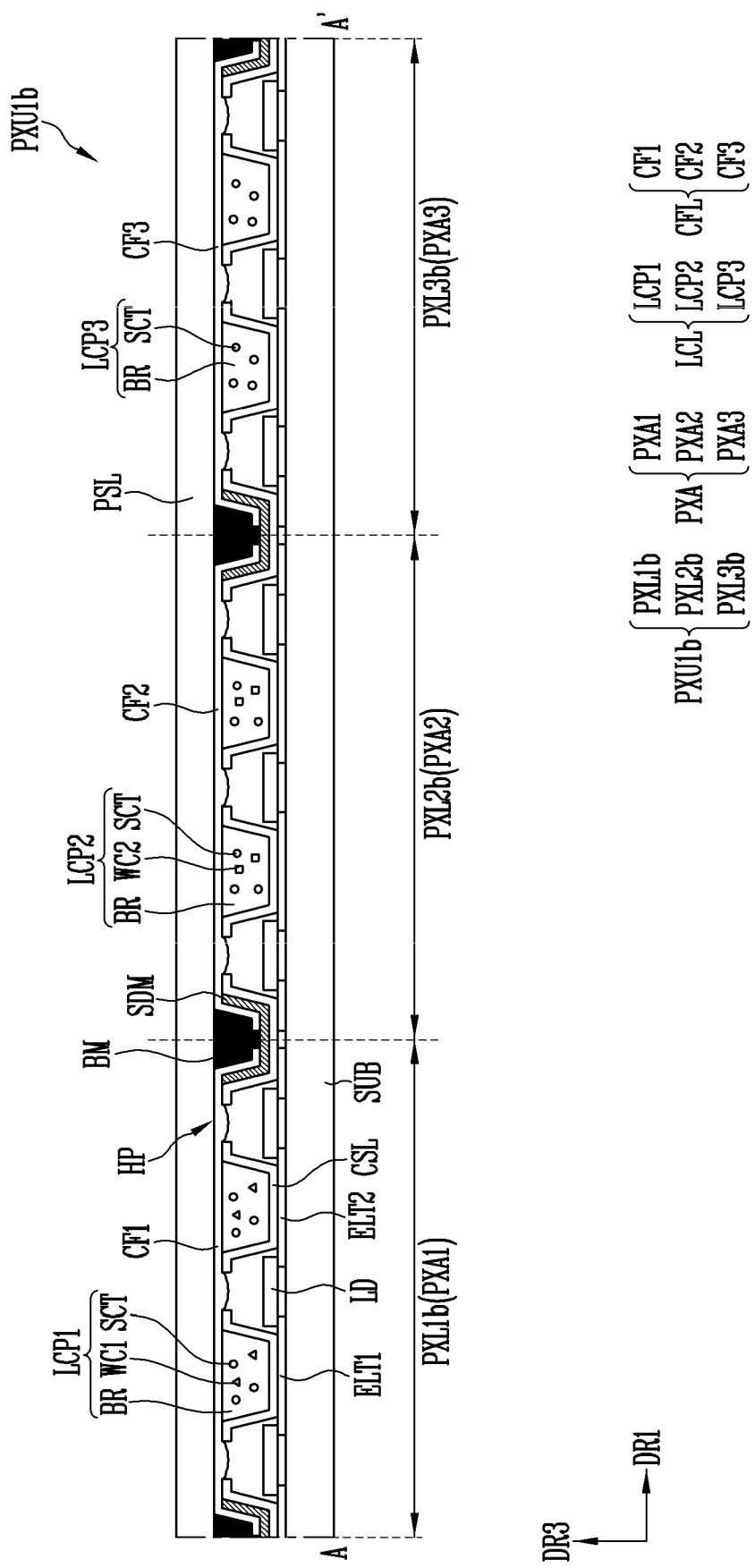
Figure 9:
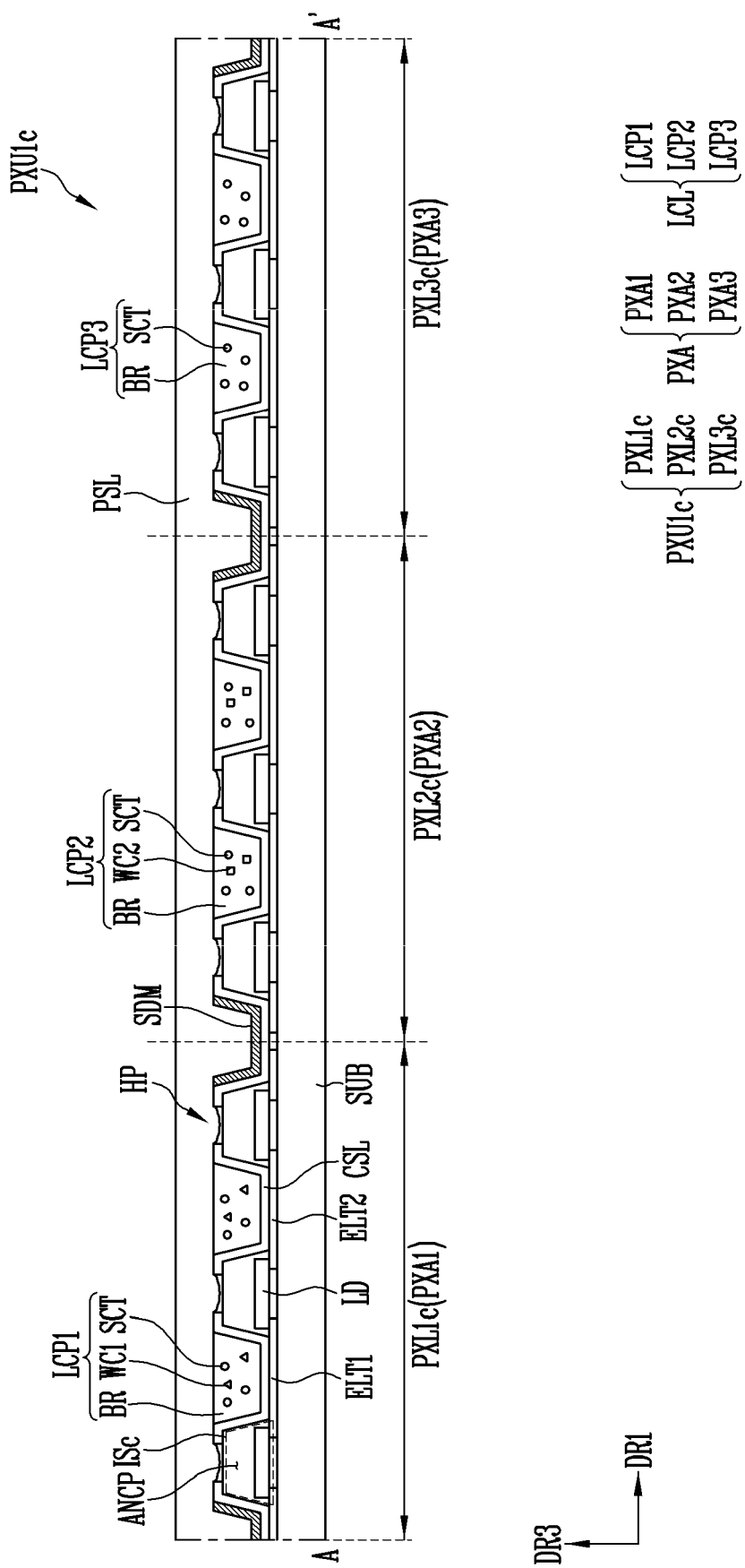

FIGS. 7 to 9 are sectional views of a pixel unit in accordance with various embodiments, corresponding to line A-A' of FIG. 5.

The embodiments illustrated in FIGS. 7 to 9 may include components equal or similar to those of the embodiment illustrated in FIG. 6. Like components will be designated by like reference numerals, and duplicative explanation thereof will be simplified or not repeated here. The following description will be focused on differences between the embodiments.

Unlike the embodiment of FIG. 6, in an embodiment illustrated in FIG. 7, a pixel unit PXU1*a* may further include a color filter layer CFL on each pixel area PXA.

Referring to FIG. 7, the pixel unit PXU1*a* may further include a color filter layer CFL. The color filter layer CFL may be provided on the substrate SUB. The color filter layer CFL may include a first color filter CF1, a second color filter CF2, and a third color filter CF3. A first pixel PXL1*a* may include the first color filter CF1. A second pixel PXL2*a* may include the second color filter CF2. A third pixel PXL3*a* may include the third color filter CF3.

The first color filter CF1 may be in the first pixel area PXA1 and may not be in the second pixel area PXA2 or the third pixel area PXA3. The second color filter CF2 may be in the second pixel area PXA2 and may not be in the first pixel area PXA1 or the third pixel area PXA3. The third color filter CF3 may be in the third pixel area PXA3 and may not be in the first pixel area PXA1 or the second pixel area PXA2.

As such, although the color filters CF1, CF2, and CF3 may be spaced apart from each other based on the respective pixel areas PXA, the present disclosure is not limited thereto. In an embodiment, portions of the color filters CF1, CF2, and CF3 may overlap with each other along the boundaries of the pixel areas PXA.

Each of the color filters CF1, CF2, and CF3 may allow light having a set or specific wavelength to transmit therethrough while partially absorbing light having the other wavelengths.

For example, the first color filter CF1 may be a red color filter. In other words, the first color filter CF1 may allow light having a red wavelength to transmit therethrough, and may partially absorb light of wavelength bands adjacent to the red wavelength, thus making it possible to sharpen (or narrow) a wavelength spectrum of red light that is expressed by the first pixel PXL1a, thereby improving the color purity.

The second color filter CF2 may be a green color filter. The second color filter CF2 may allow light having a green wavelength while partially absorbing light of wavelength bands adjacent to the green wavelength, thus making it possible to sharpen (or narrow) a wavelength spectrum of green light that is expressed by the second pixel PXL2a.

The third color filter CF3 may be a blue color filter. The third color filter CF3 may allow light having a blue wavelength while partially absorbing light of wavelength bands adjacent to the blue wavelength, thus making it possible to sharpen (or narrow) a wavelength spectrum of blue light that is expressed by the third pixel PXL3a.

Therefore, the display device may secure excellent color reproducibility by the first to third color filters CF1, CF2, and CF3.

Unlike the embodiment of FIG. 7, in an embodiment illustrated in FIG. 8, a pixel unit PXU1b may further include a black matrix BM located along the boundary of each pixel area PXA.

Referring to FIG. 8, the pixel unit PXU1b may further include a black matrix BM, a first pixel PXL1b, a second pixel PXL2b, and third pixel PXL3b. The black matrix BM may be provided on the substrate SUB and located along the boundary of each pixel area PXA.

The black matrix BM may be in the second space OS of the barrier structure CSL that is defined by the first surface S1 and the second surface S2 that are in the boundary between the corresponding pixel areas PXA. In an embodiment, the black matrix BM may overlap with the light shielding pattern SDM.

The black matrix BM may absorb light of all colors that is incident on the black matrix BM, thus preventing or reducing a light leakage phenomenon and a color mixing phenomenon between adjacent pixels.

Unlike the embodiment of FIG. 6, in an embodiment illustrated in FIG. 9, a pixel unit PXU1c may further include an anchoring pattern ANCP on a first space ISc of each pixel area PXA, and a first pixel PXL1c, a second pixel PXL2c, and third pixel PXL3c.

Referring to FIG. 9, the pixel unit PXU1c may further include an anchoring pattern ANCP in each pixel area PXA.

The anchoring pattern ANCP may be charged into the first space ISc formed between the substrate SUB and the barrier structure CSL. The anchoring pattern ANCP may cover an upper portion of the light emitting element LD. In an embodiment, the anchoring pattern ANCP may also be between the substrate SUB and the light emitting element LD.

The light emitting element LD may be stably fixed on the substrate SUB by the anchoring pattern ANCP. The anchoring pattern ANCP may prevent the light emitting element LD from being removed from the substrate SUB during a process of manufacturing the display device (or may reduce a likelihood or occurrence of such removal). Consequently, occurrences of failures that may be caused by a removed light emitting element LD may be prevented or reduced, whereby the reliability of the display device may be enhanced.

Although the anchoring pattern ANCP may be completely charged into the first space ISc formed by the substrate SUB and the barrier structure CSL, the present disclosure is not limited thereto. In an embodiment, the anchoring pattern ANCP may cover at least a portion of the light emitting element LD and be charged into only a portion of the first space ISc.

The material of the anchoring pattern ANCP is not particularly limited. In an embodiment, the anchoring pattern ANCP may include an organic material.

Figure 10:
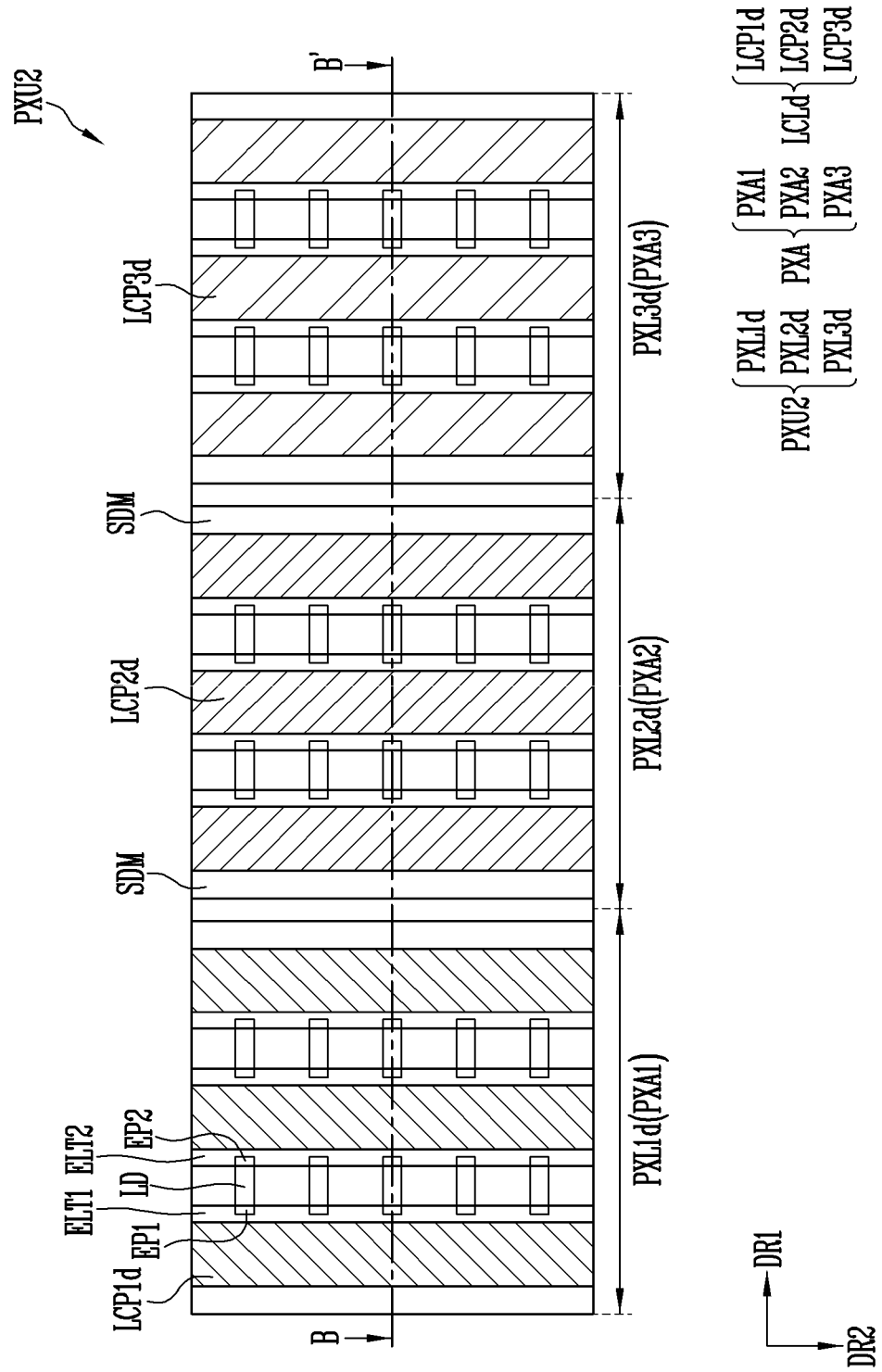
FIG. 10 is a plan view illustrating a pixel unit in accordance with an embodiment of the present disclosure.
Figure 11:
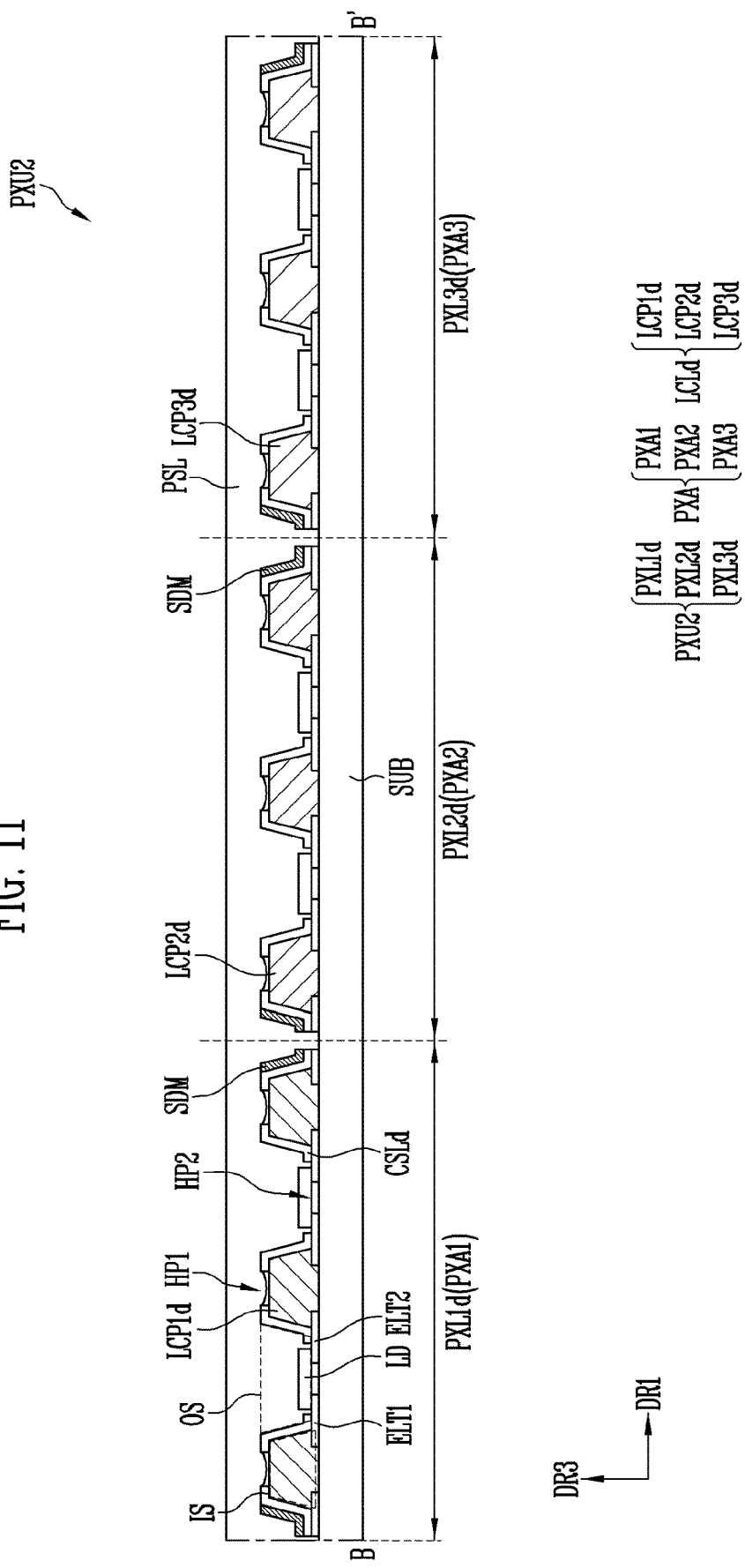
FIG. 11 is a schematic sectional view illustrating the pixel unit in accordance with an embodiment, taken along line B-B' of FIG. 10.

FIG. 10 is a plan view illustrating a pixel unit in accordance with an embodiment of the present disclosure. FIG. 11 is a schematic sectional view illustrating the pixel unit in accordance with an embodiment, taken along line B-B' of FIG. 10.

Unlike the embodiments described with reference to FIGS. 5 to 9, in the embodiment illustrated in FIGS. 10 and 11, a light conversion layer LCLd may be in the first space IS formed by the substrate SUB and a second surface S2 and a third surface S3 of a barrier structure CSLd, and the light emitting element LD may be in a second space OS formed by a first surface S1 and the second surface S2 of the barrier structure CSLd. The other configuration of the embodiment illustrated in FIGS. 10 and 11 is equal or similar to that of the embodiments described with reference to FIGS. 5 to 9.

Referring to FIGS. 10 and 11, a pixel unit PXU2 in accordance with an embodiment may include first to third pixels PXL1d, PXL2d, and PXL3d. The first to third pixels PXL1d, PXL2d, and PXL3d each may include a substrate SUB, a first electrode ELT1, a second electrode ELT2, a light emitting element LD, a barrier structure CSLd, a light conversion layer LCLd, a light shielding pattern SDM, and a passivation layer PSL.

The substrate SUB, the first electrode ELT1, the second electrode ELT2, the light emitting element LD, the light shielding pattern SDM, and the passivation layer PSL are equal or similar to those described herein above; therefore, duplicative explanation thereof will not be repeated here.

The barrier structure CSLd may be provided on the overall area of the substrate SUB. The barrier structure CSLd may be formed of a first surface S1, a second surface S2, and the third surface S3.

A first space IS may be formed between the substrate SUB and the barrier structure CSLd by the substrate SUB and the second surface S2 and the third surface S3 of the barrier structure CSLd.

A first hole HP1 may be formed in the third surface S3 of the barrier structure CSLd. The first hole HP1 may be an inlet through which the light conversion layer LCLd is injected.

The light conversion layer LCLd may be in the first space IS between the barrier structure CSLd and the substrate SUB. Although the light conversion layer LCLd in the first space IS is completely charged into the first space IS, the present disclosure is not limited thereto. For example, the light conversion layer LCLd may be partially charged into the first space IS.

The second space OS defined by the first surface S1 and the second surface S2 of the barrier structure CSLd may be formed in the barrier structure CSLd. The first space IS and the second space OS may be alternately located in the first direction DR1.

At least a portion of the first electrode ELT1 and at least a portion of the second electrode ELT2 may be located in the second space OS. The light emitting element LD may be between the first electrode ELT1 and the second electrode ELT2 of the second space OS.

A second hole HP2 may be formed in the first surface S1 of the barrier structure CSLd. The first electrode ELT1 and the second electrode ELT2 may be exposed through the second hole HP2. The light emitting element LD may be between the first electrode ELT1 and the second electrode ELT2. The light emitting element LD may come into contact (e.g., electrical, direct, or physical contact) with each of the first electrode ELT1 and the second electrode ELT2 in the second space OS and receive a driving signal from the first electrode ELT1 and the second electrode ELT2.

As described herein above, the light conversion layer LCLd may be in the first space IS formed between the substrate SUB and the barrier structure CSLd.

The light conversion layer LCLd may include a first wavelength conversion pattern LCP1d, a second wavelength conversion pattern LCP2d, and a light scattering pattern LCP3d. The first wavelength conversion pattern LCP1d may be in the first pixel area PXA1. The second wavelength conversion pattern LCP2d may be in the second pixel area PXA2. The light scattering pattern LCP3d may be in the third pixel area PXA3.

Figure 12:
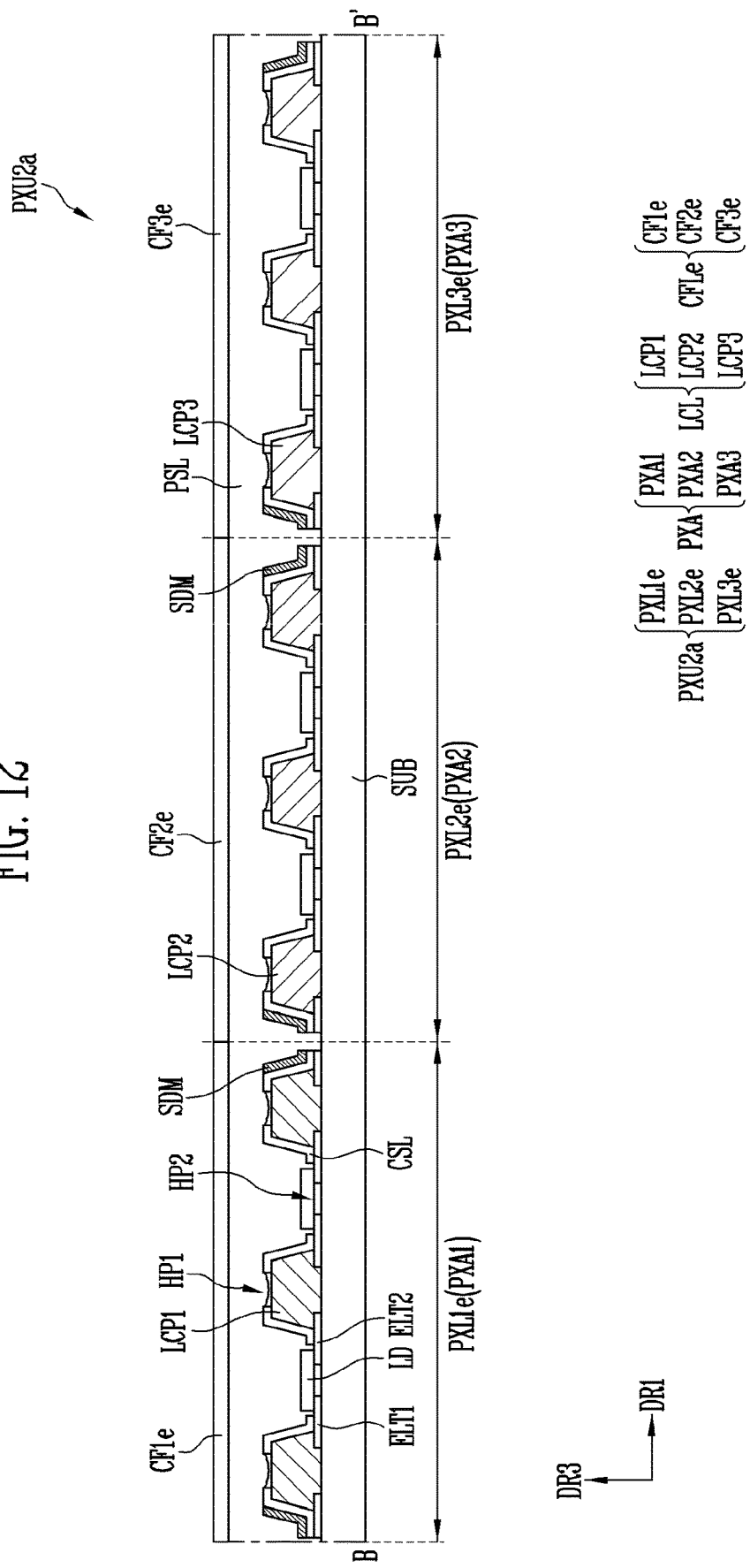
FIGS. 12 and 13 are sectional views of a pixel unit in accordance with various embodiments, corresponding to line B-B' of FIG. 10.
Figure 13:
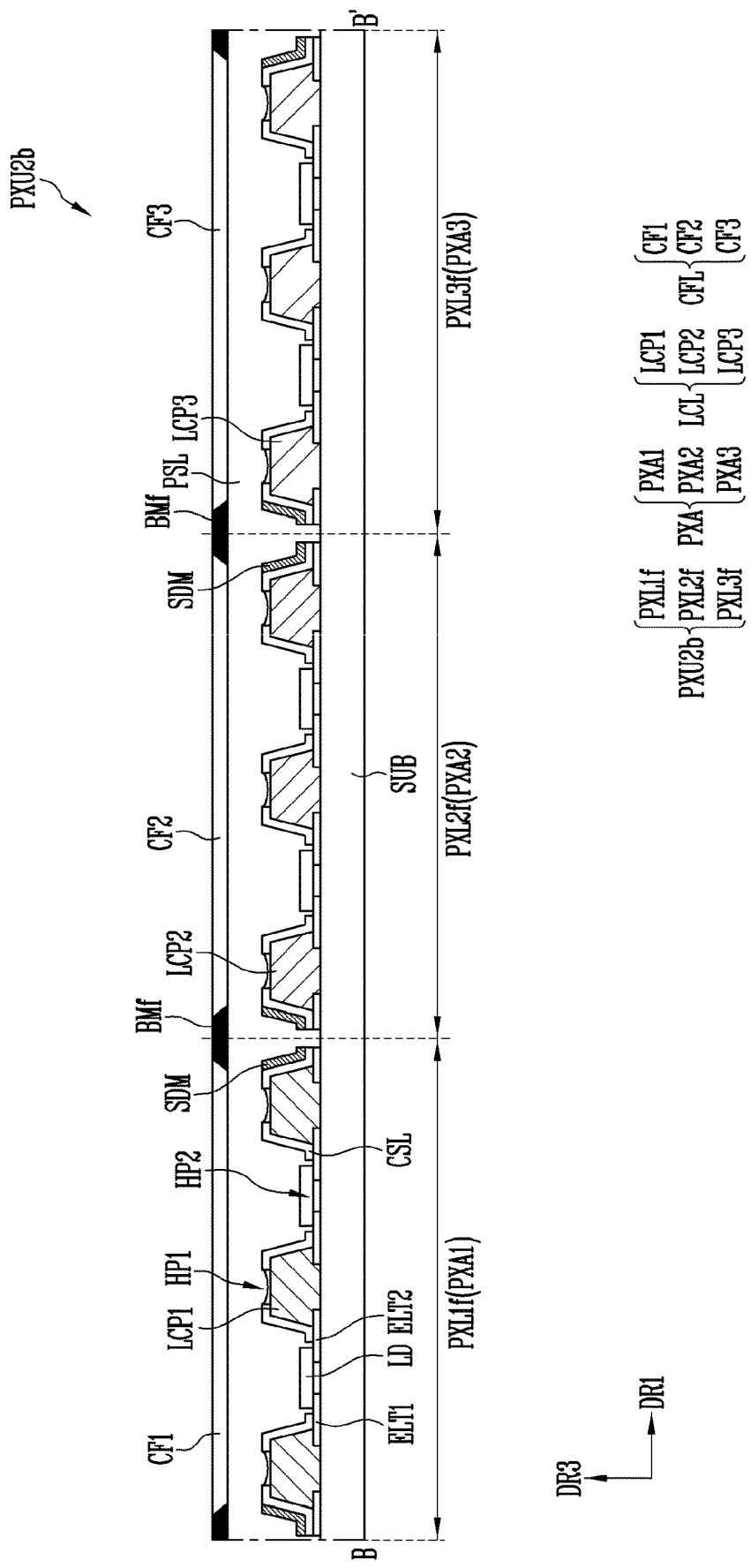

FIGS. 12 and 13 are sectional views of a pixel unit in accordance with various embodiments, corresponding to line B-B' of FIG. 10.

Referring to FIG. 12, the pixel unit PXU2a may further include a color filter layer CFLe. The color filter layer CFLe may be provided on the substrate SUB and on the passivation layer PSL.

The color filter layer CFLe may include a first color filter CF1e, a second color filter CF2e, and a third color filter CF3e. A first pixel PXL1e may include the first color filter CF1e. A second pixel PXL2e may include the second color filter CF2e. A third pixel PXL3e may include the third color filter CF3e.

Therefore, the display device may secure excellent color reproducibility by the first to third color filters CF1e, CF2e, and CF3e.

The color filter layer CFLe of FIG. 11 may have a configuration similar to that of the color filter layer CFL of FIG. 7; therefore, duplicative description of the color filter layer CFLe will not be repeated here.

Referring to FIG. 13, the pixel unit PXU2b may further include a black matrix BMf and a first pixel PXL1f, a second pixel PXL2f, and a third pixel PXL3f. There is a difference between an embodiment of FIG. 13 and the embodiment of FIG. 12, in that the black matrix BMf is further provided in the embodiment of FIG. 13. The other configuration of the embodiment of FIG. 13 is equal or similar to that of the embodiment of FIG. 12.

The black matrix BMf may be provided on the substrate SUB and on the passivation layer PSL. The black matrix BMf may be located along the boundary of each of the pixels PXL1f, PXL2f, and PXL3f and provided on the same plane as that of the color filter layer CFL.

The black matrix BMf may prevent or reduce a light leakage phenomenon which may occur between the pixels PXL1f, PXL2f, and PXL3f.

The configuration of the black matrix BMf of FIG. 13 may be similar to that of the black matrix BM of FIG. 8; therefore, duplicative description of the black matrix BMf will not be repeated here.

In various embodiments of the present disclosure, a light conversion layer may be at a position level with a light emitting element by a barrier structure, thus improving the efficiency at which light emitted from the light emitting element is incident on the light conversion layer.

The effects of the present disclosure are not limited by the foregoing, and other various effects would be understood to be included within the spirit and scope of the present disclosure.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present disclosure as set forth in the following claims, and equivalents thereof.

What is claimed is:
1. A display device comprising:
a substrate;
a first electrode and a second electrode on the substrate and spaced apart from each other in a first direction;
a light emitting element between the first electrode and the second electrode;
a light conversion layer on the substrate; and
a barrier structure on the substrate and including a first surface, a second surface, and a third surface,
wherein a first space defined by the second surface and the third surface is between the substrate and the barrier structure,
wherein a second space defined by the first surface and the second surface is in the barrier structure,
wherein the first space and the second space are alternately located in the first direction,
wherein the light conversion layer is in the first space, and
wherein the light emitting element is in the at least one second space.

2. The display device according to claim 1, wherein the first surface exposes at least a portion of the first electrode and at least a portion of the second electrode, and has a first hole overlapping the light emitting element.

3. The display device according to claim 1, wherein the third surface has a second hole overlapping the light conversion layer.

4. The display device according to claim 1, further comprising a passivation layer on the barrier structure, and a color filter on the passivation layer.

5. The display device according to claim 1, wherein the light conversion layer comprises a base resin, wavelength conversion particles dispersed in the base resin, and light scattering particles dispersed in the base resin.

6. The display device according to claim 1, wherein the first surface is closer to the substrate than is the third surface, and the first surface and the third surface are alternately arranged in the first direction.

7. The display device according to claim 6, wherein the second surface is between the first surface and the third surface and couples the first surface with the third surface.

8. The display device according to claim 1, further comprising a light shielding pattern located along the second surface in the second space in which the light emitting element is not included, wherein the light shielding pattern includes metal.

9. The display device according to claim 1, further comprising a black matrix overlapping the second space in which the light emitting element is not on the barrier structure, the black matrix being configured to absorb and block incident light.

\* \* \* \* \*